United States Patent
Fujiwara et al.

(10) Patent No.: US 6,665,854 B2
(45) Date of Patent: Dec. 16, 2003

(54) METHOD AND APPARATUS OF CHECKING MOUNT QUALITY OF CIRCUIT BOARD

(75) Inventors: Hiroaki Fujiwara, Takatsuki (JP); Masaki Okamoto, Higashiosaka (JP); Keiji Hanada, Hirakata (JP); Masashi Yokomori, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/995,635

(22) Filed: Nov. 29, 2001

(65) Prior Publication Data

US 2002/0069395 A1 Jun. 6, 2002

(30) Foreign Application Priority Data

Dec. 4, 2000 (JP) .......................................... 2000-369036
Mar. 28, 2001 (JP) ....................................... 2001-092927

(51) Int. Cl.[7] .............................................. G06F 17/50
(52) U.S. Cl. .................................. 716/15; 716/1; 716/4
(58) Field of Search .................................. 716/15, 1, 4

(56) References Cited

U.S. PATENT DOCUMENTS

| | | | | |
|---|---|---|---|---|
| 5,607,097 A | * | 3/1997 | Sato et al. ........................ | 228/8 |
| 6,064,758 A | * | 5/2000 | Jin ................................ | 382/151 |
| 6,418,552 B1 | * | 7/2002 | Osborn ........................... | 716/15 |
| 6,460,170 B1 | * | 10/2002 | Shaeffer et al. ................. | 716/15 |
| 6,496,957 B1 | * | 12/2002 | Kumagai ........................ | 716/4 |
| 2003/0014728 A1 | * | 1/2003 | Shaeffer et al. ................. | 716/15 |

FOREIGN PATENT DOCUMENTS

| | | |
|---|---|---|
| JP | 9-330342 | 12/1997 |
| JP | 11-175577 | 7/1999 |
| JP | 11-330784 | 11/1999 |

* cited by examiner

Primary Examiner—Matthew Smith
Assistant Examiner—Andrea Liu
(74) Attorney, Agent, or Firm—Wenderoth, Lind & Ponack, L.L.P.

(57) ABSTRACT

A component/board retriever 2 retrieves component/board data from CAD data supplied to a CAD data input unit 1. A circuit board information storage 3 stores various board information and outputs board information based on board design data. A component information storage 4 stores various component information and outputs component information based on component design data. A mount scheme (process) requirement storage 6 stores requirements for mounting processes. A mounting device requirements storage 7 stores requirements for mounting devices. A design analyzer 8 analyzes whether the designed circuit board is achievable or not under requirements supplied by an applied mount requirement input unit 5 and outputs the analysis results through a check result output unit 9 to a designer. Thus, changes in the mounting process requirement and/or the mounting device requirement can be easily reflected on a design check. Therefore, the number of quality checks onto the actual prototype can be reduced, and the circuit board that satisfies the target quality can be designed in the early stage of designing.

51 Claims, 33 Drawing Sheets

FIG. 3

| CIRCUIT NUMBER | COMPONENT NAME | X COORDINATE [mm] | Y COORDINATE [mm] | ANGLE [°] | ... |
|---|---|---|---|---|---|
| R101 | ERJ1GEYJ1 | 10.000 | 10.000 | 0 | ... |
| R102 | ERJ1GEYJ2 | 20.000 | 10.000 | 90 | ... |
| Q101 | TRD3ESGY | 50.000 | 50.000 | 0 | ... |
| ⋮ | | | | | |

31

| BOARD NAME | LENGTH [mm] | WIDE [mm] | HEIGHT [mm] | ACTUAL SHAPE DATA |
|---|---|---|---|---|
| BRD1002PC | 150.000 | 250.000 | 10.000 | ... |

32

| CIRCUIT NUMBER | LAND SHAPE CODE | MASK SHAPE CODE |
|---|---|---|
| R101 | LND1608R | MSK1608R |
| R102 | LND1608R | MSK1608R |
| Q101 | LNDTRD3GY | MSKTRD3GY |
| ⋮ | | |

33

| MARK NAME | MARK SHAPE CODE | X COORDINATE [mm] | Y COORDINATE [mm] | ANGLE [°] |
|---|---|---|---|---|
| BRDMRK1 | SQ10 | 5.000 | 5.000 | 0 |

| BOARD NAME | BOARD MATERIAL | THE NUMBER OF LAYERS | ACTUAL SHAPE DATA |
|---|---|---|---|
| BRD1002PC | GLASS EPOXY | 4 | ... |
| BRD5001PC | PAPER PHENOL | 2 | ... |
| ⋮ | | | |

41

| LAND/MASK SHAPE CODE | LENGTH [mm] | WIDE [mm] | ACTUAL SHAPE DATA |
|---|---|---|---|
| LND1608R | 1.500 | 0.800 | ... |
| LNDTRD3GY | 1.000 | 0.800 | ... |
| MSK1608R | 1.500 | 0.800 | ... |
| MSKTRD3GY | 1.000 | 0.800 | ... |
| ⋮ | | | |

42

| MARK SHAPE CODE | LENGTH [mm] | WIDE [mm] |
|---|---|---|
| SQ10 | 1.500 | 1.500 |

| COMPONENT NAME | COMPONENT SHAPE CODE | PACKAGING CODE |
|---|---|---|
| ERJ1GEYJ1 | 1608R | P0804 |
| ERJ1GEYJ2 | 1608R | P0804 |
| TRD3ESGY | TRD3 | E1208 |
| ⋮ | | |

51

| COMPONENT SHAPE CODE | LENGTH [mm] | WIDE [mm] | HEIGHT [mm] | THE NUMBER OF LEADS (RIGHT SIDE) | LEAD PITCH (RIGHT SIDE) | ... |
|---|---|---|---|---|---|---|
| 1608R | 1.600 | 0.800 | 0.500 | 1 | 0 | ... |
| TRD3 | 2.500 | 1.250 | 0.800 | 2 | 1.0 | ... |
| ⋮ | | | | | | |

52

| PACKAGING CODE | TYPE | TAPE WIDTH | COMPONENT PITCH | ... |
|---|---|---|---|---|
| P0804 | PAPER | 8.000 | 0.400 | ... |
| E1208 | EMBOS | 12.000 | 0.800 | ... |
| ⋮ | | | | |

| SOLDERING SCHEME REQUIREMENT |||||
|---|---|---|---|---|
| MOUNTING FACTORY = A FACTORY |||||
| MAJOR KEY | INTERMEDIATE KEY | MINOR KEY | REQUIREMENTS | REFERENCE VALUE |
| FLOW | SOLDERING MATERIAL A | BOARD MATERIAL A | DISTANCE BETWEEN COMPONENTS | REQUIREMENT A |
| | | | DISTANCE BETWEEN TEST POINTS | REQUIREMENT A |
| | | | LAND AREA | REQUIREMENT B |
| | | BOARD MATERIAL B | DISTANCE BETWEEN COMPONENTS | REQUIREMENT C |
| | | | DISTANCE BETWEEN TEST POINTS | REQUIREMENT A |
| | | | LAND AREA | REQUIREMENT B |
| | SOLDERING MATERIAL B | BOARD MATERIAL A | ... | ... |
| | | | ... | ... |
| REFLOW | SOLDERING MATERIAL A | BOARD MATERIAL A | ... | ... |
| | | | ... | ... |

62

| BOARD PROCESSING REQUIREMENT |||||
|---|---|---|---|---|
| MOUNTING FACTORY = A FACTORY |||||
| MAJOR KEY | INTERMEDIATE KEY | MINOR KEY | REQUIREMENTS | REFERENCE VALUE |
| PERFORATION CUT | USE OF PROCESS MACHINE A | BOARD MATERIAL A | DISTANCE BETWEEN CUT LINE AND COMPONENT | REQUIREMENT A |
| | | BOARD MATERIAL B | DISTANCE BETWEEN CUT LINE AND COMPONENT | REQUIREMENT B |
| V CUT | USE OF PROCESS MACHINE C | BOARD MATERIAL A | DISTANCE BETWEEN CUT LINE AND COMPONENT | REQUIREMENT A |
| | | ... | ... | ... |

63

| DESIGN REFERENCE VALUE DATA ||||
|---|---|---|---|
| REQUIREMENT A ||||
| REQUIREMENTS | KEY | DETAIL | CHECK VALUE |
| DISTANCE BETWEEN COMPONENTS | COMPONENT | CHIP | EQUAL TO OR LARGER THAN 0.5mm |
| | | RESISTOR A | EQUAL TO OR LARGER THAN 1.0mm |
| | | RESISTOR B | EQUAL TO OR LARGER THAN 1.2mm |
| | | CAPACITOR A | EQUAL TO OR LARGER THAN 2.0mm |
| DISTANCE BETWEEN TEST POINTS | COMPONENT | ... | ... |

| MOUNTABLE COMPONENT | | | |
|---|---|---|---|
| MOUNTING FACTORY = A FACTORY | | | |
| MAJOR KEY | INTERMEDIATE KEY | MINOR KEY | CHECK VALUE |
| M V 2 | COMPONENT | CHIP | MOUNTABLE |
| | | RESISTOR A | MOUNTABLE |
| | | RESISTOR B | UNMOUNTABLE |
| | | CAPACITOR A | MOUNTABLE |
| M P A V | COMPONENT | CHIP | MOUNTABLE |
| | | RESISTOR A | MOUNTABLE |
| | | ... | ... |
| ⋮ | | | |

72

| MOUNTING OPERATIONAL REQUIREMENT | | | | |
|---|---|---|---|---|
| MOUNTING FACTORY = A FACTORY | | | | |
| MAJOR KEY | INTERMEDIATE KEY | MINOR KEY | REQUIREMENTS | REFERENCE VALUE |
| M V 2 | COMPONENT | CHIP | DISTANCE BETWEEN COMPONENTS | REQUIREMENT C |
| | | RESISTOR A | DISTANCE BETWEEN COMPONENTS | REQUIREMENT C |
| | | CAPACITOR A | DISTANCE BETWEEN COMPONENTS | REQUIREMENT C |
| M P A V | COMPONENT | CHIP | DISTANCE BETWEEN COMPONENTS | REQUIREMENT D |
| | | ... | ... | ... |
| ⋮ | | | | |

73

| DESIGN REFERENCE VALUE DATA | | | |
|---|---|---|---|
| REQUIREMENT C | | | |
| REQUIREMENTS | KEY | DETAIL | CHECK VALUE |
| DISTANCE BETWEEN COMPONENTS | COMPONENT | CHIP | EQUAL TO OR LARGER THAN 0.3mm |
| | | RESISTOR A | EQUAL TO OR LARGER THAN 0.8mm |
| | | RESISTOR B | EQUAL TO OR LARGER THAN 1.2mm |
| | | CAPACITOR A | EQUAL TO OR LARGER THAN 2.0mm |
| DISTANCE BETWEEN TEST POINTS | COMPONENT | ... | ... |
| ⋮ | | | |

FIG. 8

| REQUIREMENT APPLICATION | | | |  81
|---|---|---|---|
| MOUNTING FACTORY = A FACTORY | | | |
| CHECK ITEM | KEY | DETAIL | REQUIREMENTS |
| COMPONENT MOUNTING POSITION | SOLDERING QUALITY | COMPONENT ARRANGEMENT | DISTANCE BETWEEN COMPONENTS |
| | | | DISTANCE BETWEEN TEST POINTS |
| | | PATTERN ARRANGEMENT | LAND AREA |
| | | | IC SLANT LINE WIRING START POSITION |
| | HITTING POINT | BOARD DIVIDING MACHINE | DISTANCE BETWEEN CUT LINE AND COMPONENT |
| | | | ... |
| ⋮ | | | |

FIG. 9

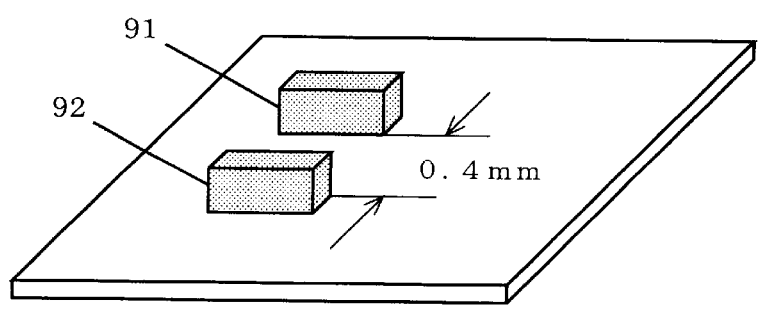

MOUNT REQUIREMENT
- A FACTORY
- FLOW
- BOARD MATERIAL A

FIG. 11

| MOUNT QUALITY CHECK RESULTS | | | | | |
|---|---|---|---|---|---|
| SPECIFIED REQUIREMENT = A FACTORY, FLOW, BOARD MATERIAL A | | | | | |
| CHECK ITEM | REQUIREMENT | ASSUMPTION | REFERENCE VALUE | DESIGN VALUE | RESULT |
| COMPONENT MOUNTING POSITION | DISTANCE BETWEEN COMPONENTS | SOLDERING MATERIAL A | EQUAL TO OR LARGER THAN 0.5mm | 0.4mm | N G |
| | | SOLDERING MATERIAL B | EQUAL TO OR LARGER THAN 0.4mm | 0.4mm | O K |
| ⋮ | | | | | |

| MOUNTABLE COMPONENT | | | | |
|---|---|---|---|---|
| MOUNTING FACTORY = A FACTORY | | | | |
| MAJOR KEY | INTERMEDIATE KEY | MINOR KEY | CHECK VALUE | MOUNT CYCLE TIME [sec] |
| M V 2 | COMPONENT | CHIP | MOUNTABLE | 0.10 |
| | | RESISTOR A | MOUNTABLE | 0.15 |
| | | RESISTOR B | UNMOUNTABLE | — |
| | | CAPACITOR A | MOUNTABLE | 0.20 |
| M P A V | COMPONENT | CHIP | MOUNTABLE | 0.40 |
| | | RESISTOR A | MOUNTABLE | 0.50 |
| | | ... | ... | ... |
| ⋮ | | | | |

FIG. 13

| CIRCUIT NUMBER | DEVIATION | INVERSION | MISSING | BRIDGE | ... |
|---|---|---|---|---|---|
| R101 | 1 0 | 2 | 0 | 0 | ... |
| R102 | 5 | 1 | 0 | 0 | ... |
| Q101 | 0 | 0 | 0 | 1 | ... |
| ⋮ | | | | | |

FIG. 16

| DATA NAME : BRD0011 | | | | | |
|---|---|---|---|---|---|
| MOUNTING ORDER | CIRCUIT NUMBER | COMPONENT NAME | X COORDINATE [mm] | Y COORDINATE [mm] | ANGLE [°] |
| 1 | R101 | ERJ3EYG10 | 15.000 | 10.000 | 90 |
| 2 | R102 | ERJ3EYG20 | 15.000 | 10.000 | 90 |
| 3 | C101 | ECJ4EYD10 | 30.000 | 35.000 | 90 |
| 4 | Q101 | TRD3GEY | 35.000 | 20.000 | 0 |

161

| DATA NAME : BRD0011 | | | |
|---|---|---|---|
| CIRCUIT BOARD NAME | X DIMENSION [mm] | Y DIMENSION [mm] | Z DIMENSION [mm] |
| BRD101 | 50.000 | 40.000 | 16.000 |

162

| DATA NAME : BRD0011 | |
|---|---|
| COMPONENT NAME | COMPONENT SHAPE CODE |
| ERJ3EYG10 | 1608R |
| ERJ3EYG20 | 1608R |
| ECJ4EYD10 | 2125C |
| TRD3GEY | TRD3E |

163

| COMPONENT SHAPE CODE | OUTER DIMENSION [mm] | | | THE NUMBER OF LEADS | | | |
|---|---|---|---|---|---|---|---|
| | X DIRECTION | Y DIRECTION | Z DIRECTION | UPPER SIDE | LOWER SIDE | LEFT SIDE | RIGHT SIDE |
| 1608R | 0.800 | 1.600 | 0.500 | 0 | 0 | 0 | 0 |
| 2125C | 1.250 | 2.500 | 0.800 | 0 | 0 | 0 | 0 |
| TRD3E | 2.000 | 3.200 | 0.800 | 0 | 0 | 1 | 2 |
| LEAD PITCH [mm] | | | | LEAD WIDTH [mm] | | | |
| UPPER SIDE | LOWER SIDE | LEFT SIDE | RIGHT SIDE | UPPER SIDE | LOWER SIDE | LEFT SIDE | RIGHT SIDE |
| 0 | 0 | 0 | 0 | 0 | 0 | 0 | 0 |
| 0 | 0 | 0 | 0 | 0 | 0 | 0 | 0 |
| 0 | 0 | 1.000 | 1.000 | 0 | 0 | 2.000 | 1.800 |
| LEAD LENGTH [mm] | | | | LEAD THICKNESS [mm] | | | |
| UPPER SIDE | LOWER SIDE | LEFT SIDE | RIGHT SIDE | UPPER SIDE | LOWER SIDE | LEFT SIDE | RIGHT SIDE |
| 0 | 0 | 0 | 0 | 0 | 0 | 0 | 0 |
| 0 | 0 | 0 | 0 | 0 | 0 | 0 | 0 |
| 0 | 0 | 2.300 | 2.300 | 0 | 0 | 0.500 | 0.500 |

| COMPONENT NAME | COMPONENT OPERATION CODE |
|---|---|
| ERJ3EYG10 | M1608R |
| ERJ3EYG20 | M1608R |
| ECJ4EYD10 | M2125C |
| TRD3GEY | MTRD3E |

171

| COMPONENT OPERATION CODE | SUCTION NOZZLE | ALLOWABLE RANGE BETWEEN COMPONENTS | | NOZZLE FALLING POSITION [mm] | NOZZLE OFFSET | |
|---|---|---|---|---|---|---|
| | | X [mm] | Y [mm] | | X [mm] | Y [mm] |
| M1608R | S | ±0.100 | ±0.050 | 0.500 | 0 | 0 |
| M2125C | S | ±0.200 | ±0.100 | 2.500 | 0 | 0 |
| MTRD3E | M | ±0.400 | ±0.400 | 2.300 | 0 | 0 |

172

| MOUNTABLE AREA [mm] | | UNMOUNTABLE RANGE OF BOARD'S BOTH ENDS [mm] | | ALLOWABLE HEIGHT RANGE BEFORE MOUNTING [mm] | |
|---|---|---|---|---|---|
| X MAX | Y MAX | UPPER END | LOWER END | MOUNT SURFACE | BACK SURFACE |
| 330 | 242 | 0~3 | 0~4 | 0~15 | 0~30 |

| MOUNTING NOZZLE | NOZZLE DIAMETER [mm] |
|---|---|
| S | 1.000 |
| M | 1.200 |

| CIRCUIT BOARD DATA NAME |
|---|
| BDR0011 |
| BDR0012 |
| BDRJ331 |

| DATA NAME: BRD0012 | | | | | | | 211 |
|---|---|---|---|---|---|---|---|
| DEVICE NAME | MOUNTING ORDER | CIRCUIT NUMBER | COMPONENT NAME | X COORDINATE [mm] | Y COORDINATE [mm] | ANGLE [°] | |
| MH1 | 1 | R101 | ERJ3EYG10 | 15.000 | 10.000 | 90 | |
| MH1 | 2 | R102 | ERJ3EYG20 | 15.000 | 10.000 | 90 | |
| MP1 | 1 | C101 | ECJ4EYD10 | 30.000 | 35.000 | 90 | |
| MP2 | 1 | Q101 | TRD3GEY | 35.000 | 20.000 | 0 | |

212

| DATA NAME: BRD0012 | | | |
|---|---|---|---|
| CIRCUIT BOARD NAME | X DIMENSION [mm] | Y DIMENSION [mm] | Z DIMENSION [mm] |
| BRD101 | 50.000 | 40.000 | 16.000 |

213

| DATA NAME: BRD0012 | |
|---|---|
| COMPONENT NAME | COMPONENT SHAPE CODE |
| ERJ3EYG10 | 1608R |
| ERJ3EYG20 | 1608R |
| ECJ4EYD10 | 2125C |
| TRD3GEY | TRD3E |

214

| COMPONENT SHAPE CODE | OUTER DIMENSION [mm] | | | THE NUMBER OF LEADS | | | |
|---|---|---|---|---|---|---|---|
| | X DIRECTION | Y DIRECTION | Z DIRECTION | UPPER SIDE | LOWER SIDE | LEFT SIDE | RIGHT SIDE |
| 1608R | 0.800 | 1.600 | 0.500 | 0 | 0 | 0 | 0 |
| 2125C | 1.250 | 2.500 | 0.800 | 0 | 0 | 0 | 0 |
| TRD3E | 2.000 | 3.200 | 0.800 | 0 | 0 | 1 | 2 |
| LEAD PITCH [mm] | | | | LEAD WIDTH [mm] | | | |
| UPPER SIDE | LOWER SIDE | LEFT SIDE | RIGHT SIDE | UPPER SIDE | LOWER SIDE | LEFT SIDE | RIGHT SIDE |
| 0 | 0 | 0 | 0 | 0 | 0 | 0 | 0 |
| 0 | 0 | 0 | 0 | 0 | 0 | 0 | 0 |
| 0 | 0 | 1.000 | 1.000 | 0 | 0 | 2.000 | 1.800 |
| LEAD LENGTH [mm] | | | | LEAD THICKNESS [mm] | | | |
| UPPER SIDE | LOWER SIDE | LEFT SIDE | RIGHT SIDE | UPPER SIDE | LOWER SIDE | LEFT SIDE | RIGHT SIDE |
| 0 | 0 | 0 | 0 | 0 | 0 | 0 | 0 |
| 0 | 0 | 0 | 0 | 0 | 0 | 0 | 0 |
| 0 | 0 | 2.300 | 2.300 | 0 | 0 | 0.500 | 0.500 |

FIG. 22

| COMPONENT NAME | DEVICE NAME | COMPONENT OPERATION CODE |
|---|---|---|
| ERJ3EYG10 | MH1 | M1608R |
| ERJ3EYG20 | MH1 | M1608R |
| ECJ4EYD10 | MP1 | M2125C |
| TRD3GEY | MP2 | MTRD3E |

221

| COMPONENT OPERATION CODE | SUCTION NOZZLE | ALLOWABLE RANGE BETWEEN COMPONENTS | | NOZZLE FALLING POSITION [mm] | NOZZLE OFFSET | |
|---|---|---|---|---|---|---|
| | | X [mm] | Y [mm] | | X [mm] | Y [mm] |
| M1608R | S | ±0.100 | ±0.050 | 0.500 | 0 | 0 |
| M2125C | S | ±0.200 | ±0.100 | 2.500 | 0 | 0 |
| MTRD3E | M | ±0.400 | ±0.400 | 2.300 | 0 | 0 |

222

| DEVICE NAME | MOUNTABLE AREA [mm] | | UNMOUNTABLE RANGE OF BOARD'S BOTH ENDS [mm] | | ALLOWABLE HEIGHT RANGE BEFORE MOUNTING [mm] | |
|---|---|---|---|---|---|---|
| | X MAX | Y MAX | UPPER END | LOWER END | MOUNT SURFACE | BACK SURFACE |
| MH1 | 330 | 242 | 0~3 | 0~4 | 0~15 | 0~30 |
| MP1 | 330 | 242 | 0~3 | 0~4 | 0~15 | 0~30 |
| MP2 | 330 | 242 | 0~3 | 0~4 | 0~15 | 0~30 |

| DEVICE NAME | MOUNTING NOZZLE | NOZZLE DIAMETER [mm] |
|---|---|---|
| MH1 | S | 0.800 |
| MP1 | S | 1.000 |
| MP2 | M | 1.200 |

223

| MOUNTING ORDER | DEVICE NAME |
|---|---|
| 1 | MH1 |
| 2 | MP1 |
| 3 | MP2 |

| CIRCUIT BOARD DATA NAME | CIRCUIT BOARD DATA STORAGE TIME |
|---|---|
| BRD0011 | 2000/12/25-12:20:20 |
| | |

*322*

| FACILITY OPERATION DATA STORAGE TIME |
|---|
| 2000/12/25-12:21:00 |

*323*

| 3D GRAPHICS DATA NAME | CIRCUIT BOARD DATA NAME | CIRCUIT BOARD DATA STORAGE TIME | FACILITY OPERATION DATA STORAGE TIME |
|---|---|---|---|
| | | | |
| | | | |

(a)

*321*

| CIRCUIT BOARD DATA NAME | CIRCUIT BOARD DATA STORAGE TIME |
|---|---|
| BRD0011 | 2000/12/25-14:20:20 |
| | |

*322*

| FACILITY OPERATION DATA STORAGE TIME |
|---|
| 2000/12/25-12:21:00 |

*323*

| 3D GRAPHICS DATA NAME | CIRCUIT BOARD DATA NAME | CIRCUIT BOARD DATA STORAGE TIME | FACILITY OPERATION DATA STORAGE TIME |
|---|---|---|---|
| BRD0011-1 | BRD0011 | 2000/12/25-12:20:20 | 2000/12/25-12:21:00 |
| | | | |

| DATA NAME : BRD0011 | | | | | |
|---|---|---|---|---|---|
| MOUNTING ORDER | CIRCUIT NUMBER | COMPONENT NAME | X COORDINATE [mm] | Y COORDINATE [mm] | ANGLE [°] |
| 1 | R101 | ERJ3EYG10 | 15.000 | 20.000 | 90 |
| 2 | R102 | ERJ3EYG20 | 15.000 | 10.000 | 90 |
| 3 | C101 | ECJ4EYD10 | 30.000 | 35.000 | 90 |
| 4 | Q101 | TRD3GEY | 35.000 | 20.000 | 0 |

FIG. 34

| 3D GRAPHICS DATA NAME | CIRCUIT BOARD DATA NAME | CIRCUIT BOARD DATA STORAGE TIME | FACILITY OPERATION DATA STORAGE TIME |
|---|---|---|---|
| BRD0011-1 | BRD0011 | 2000/12/25-12:20:20 | 2000/12/25-12:21:00 |
| BRD0011-2 | BRD0011 | 2000/12/25-14:20:20 | 2000/12/25-12:21:00 |

METHOD AND APPARATUS OF CHECKING MOUNT QUALITY OF CIRCUIT BOARD

BACKGROUND OF THE INVENTION

1. Field of the Invention

The present invention relates to methods and apparatuses of checking the mount quality of a circuit board. More specifically, the present invention relates to a mount quality checking method for designing a circuit board that satisfies the target quality by predicting the quality of the circuit board having electronic components mounted thereon by a mounting device, a method of displaying a virtual 3D image showing a mount state for the mount quality check, and an apparatus using either or both of the methods.

2. Description of the Background Art

Conventionally, for designing a circuit board, designers refer to a design manual or use a design rule check (DRC) in a CAD system for trying to comply with predetermined design standards in order to determine component arrangement positions, pattern shapes, land shapes, and others. Also, the designers manufacture a prototype of a designed circuit board to see if any problem may occur at the time of manufacturing, or the designers have a 2-D image (virtual prototype) showing the mount state of the circuit board displayed on a screen of a computer device to see if any problem may occur or not. Then, the designers give some feedback about the found problem to the design.

By repeating such a designing-to-prototyping (virtual prototyping) process several times like a loop, the mount quality of the circuit board can be ensured when mass-produced.

To further improve the mount quality, some methods are suggested in Japanese Patent Laid-Open Publication Nos. 9-330342 (1997-330342) and 11-175577 (1999-175577) for predicting and checking the mount quality of the circuit board.

In these methods, the mount quality is predicted only from device data such as the shapes of the components and the shapes of the circuit board, that is, without consideration of a variety of mounting devices and mounting processes. In fact, depending on the mounting device to be used, a pitch between mount components can be determined to be a narrow one (if a small nozzle is used or high-precision positioning is possible, for example) or a standard one.

In Japanese Patent Laid-Open Publication No. 11-330784 (1999-330784), a method of checking the mount quality in consideration of a circuit board manufacturing process is disclosed, which is shown in FIG. 37.

In this method, reference rules for manufacturing are registered in advance in a factory (manufacturing) section. A design section checks designed parts according to design rules which are formulated based on the reference rules.

In the above conventional methods, however, based on the operation requirements of the mounting devices and the requirements of the mount process, the operators have to derive a check value for each check part on the circuit board and refer to the derived check values as manufacturing reference rules. Therefore, if the requirements of the mounting devices, materials, and others are changed, it is not easy to predict how such change will affect the reference rules.

To ensure the mount quality, productivity may have to be decreased in some cases. For example, depending on the mounting device, the operational speed may have to be reduced to ensure accuracy. Also, processing may have to be carried out mainly by a specific facility at the cost of a load balance among the facilities.

On the design side, a plurality of processes may be taken for changing the design to ensure the mount quality. Among these methods, the designer is supposed to appropriately select a highest-productive, lowest-cost method, but he/she may have difficulty doing so at the time of changing the design in consideration of both productivity and cost.

In the conventional method of virtually making a prototype for displaying the mount state of the circuit board on the screen of a computer device, the components are displayed only by two-dimensional plane graphics. Therefore, when two components which differ in their respective upper shapes ((a) of FIG. 38) are two-dimensionally displayed, they look the same ((b) of FIG. 38). Also, when two components which differ in their respective heights ((c) of FIG. 38) are two-dimensionally displayed, they look the same ((d) of FIG. 38). Therefore, a detailed check of the mount requirements as to the shape and height of the components cannot be performed, and a sufficient study therefore cannot be made.

SUMMARY OF THE INVENTION

Therefore, an object of the present invention is to provide a method of checking the mount quality of a circuit board, a method of displaying the mount state of circuit board in a virtual three-dimensional display, and an apparatus using either or both of the above methods. With these methods and apparatus, if the mounting process to be used, the operation requirement of the mounting device, and others are changed, such a change can be easily reflected on the design check. Therefore, consideration of the mount quality during the mounting procedure reduces the number of quality checks onto the actual prototype, and the circuit board that satisfies the target quality can be designed in the early stage of designing.

The present invention has the following features to attain the object above.

A first aspect of the present invention is directed to a method of checking a mount quality of a circuit board having components mounted thereon by a mounting device, and the method includes the steps of:

receiving board information related to the circuit board to be used in a designed circuit, component information related to the components to be used, and position information related to a mounting position of the component;

receiving a mount requirement specifying a mounting process and a mounting device to be used in manufacturing the circuit board; and checking, based on a requirement for the mounting process and a requirement for operation of the mounting device, to see whether the circuit board manufactured from the board information, the component information, and the position information under the mount requirement can satisfy a predetermined target mount quality.

As such, in the method according to the first aspect, the requirements are registered in advance for respective mounting processes and mounting devices. When the mounting process to be used and/or the operation requirements for the mounting device is/are changed, the change is easily reflected on a design check. Therefore, consideration of the mount quality during the mounting procedure reduces the number of quality checks onto the actual prototype, and the circuit board that satisfies the target quality can be designed in the early stage of designing.

Preferably, the check in the method according to the first aspect is made based on the requirement for the mounting process and the requirement for operation of the mounting device in order to see whether the circuit board manufactured from the board information, the component information, and the position information under the mount requirement can satisfy a predetermined target productivity.

As such, by checking the mount quality of the circuit board and the productivity (cost), it is possible to design a lower-cost circuit having more productivity and satisfying the requirements for the target mount quality.

Here, the component information includes at least a number, a shape, a packaging, and a size of each of the components. The board information includes at least a material, a shape, a thickness of the board, a land shape, a printed mask shape, and a position correction mark shape of each of the components. The requirement for the mounting process includes at least soldering processes, a soldering material to be used, and a board process/inspection after the components are mounted. The requirement for operation of the mounting device includes at least a mountable component type, a mount accuracy for each of the components, a mount cycle time, and a mountable range. The mount quality is checked as to at least the mounting position of the component, a state of soldering, a board process/inspection after the components are mounted, and a state of holding an outer shape of the board.

By checking the mount quality with the above information and requirements, it is possible to quickly and correctly design a circuit board satisfying the target quality.

Also, the component information and the requirement for operation of the mounting device is preferably retrieved from a CAM system that generates operation data (NC data) of the mounting device.

As such, the component information and the requirement for operation of the mounting device are retrieved from the CAM system side, thereby avoiding data redundancy and reducing the workload.

Furthermore, the requirement for the mount process and the requirement for operation of the mounting device is preferably changed based on the quality of the performance of the circuit board which is actually manufactured.

As such, the performance of the circuit board which is actually manufactured is fed back to the requirements, thereby allowing for the circuit board to be quickly and correctly designed with less of a defective condition at the time of the next circuit board is designed.

Still further, when the mount quality is rechecked after the circuit board is changed, only a range corresponding to a portion which was changed or a portion at which an error occurred is preferably checked.

As such, only a range corresponding to a portion which was changed or a portion at which an error occurred is rechecked. Such a limited-area recheck requires less time than an entire-board recheck.

A second aspect of the present invention is directed to a method of virtually displaying a state of the electronic components mounted on a circuit board by one or more mounting devices based on the data used by the mounting devices. The method includes the steps of:

receiving, as the data used by the mounting devices, circuit board data including information about a mounting position and a shape of each component mounted on the circuit board, and information about a shape of the circuit board;

receiving, for each of the mounting devices, facility operation data including information about operation requirements of the mounting device, such as a type and a falling position of a suction nozzle to be used, an allowable distance between the components, and an operable area;

storing the circuit board data and the facility operation data;

selecting a circuit board from the stored circuit board data to be displayed in 3D;

generating 3D graphics data for displaying outer shapes of the circuit board and the components at respective mounting positions by retrieving data required for the circuit board data of the selected circuit board from the stored facility operation data, and calculating data representing a state of the circuit board having the components mounted thereon; and displaying an image based on the generated 3D graphics data.

In the method according to the second aspect, the mount state of the circuit board is displayed in 3D with the components mounted thereon based on the received mount data (the circuit board data and facility operation data), and the operation requirements for the mounting device to be used are also displayed in 3D. Thus, the mount data can be virtually checked without using any prototype of the actual board, and it is also more reliably evaluated. By reducing the workload of the designer by obviating the need to make a prototype, the electronic components can be mounted within a shorter period of time and at a lower cost. Moreover, the method according to the second aspect of the present invention is also applicable to a case where the components are mounted by a plurality of mounting devices.

Preferably, the 3D graphics data is generated for displaying positions of the components after they are mounted, a component assignment to each mounting device, an order of mounting the components, and a state of any component being sucked by a suction nozzle in 3D. Also, a mounting operation is displayed by successively displaying moving images according to the order of mounting the components.

By displaying the mount state of the circuit board by using the above information and display process, the mount data can be checked more quickly and reliably.

Also, the stored circuit board data or the stored facility operation data is preferably changed with regard to component information, mounting position information, a type or falling position information of a suction nozzle, and the changed data is then stored.

At this time, more preferably, a storage time of the changed data is stored as history. Also, when an image is displayed based on 3D graphics data newly generated from the changed data, the 3D graphics data generated before the changed data is searched for from the stored history, and the image is displayed based on the 3D graphics data after the changed data and the 3D graphics data before the changed data to show a difference in the mount state after the change. Furthermore, the 3D graphics data after change is stored in relation to the storage time as the history.

As such, by displaying and checking the changed mount data through a 3D image, the mount data can be changed and checked more quickly and correctly.

Furthermore, preferably, when the component cannot be mounted at the mounting position specified in the circuit board data, an error-state 3D graphics data is generated for representing a defective part or the cause thereof, and the image is displayed based on the 3D graphics data and the error-state 3D graphics data.

As such, the defective part in the mount data can be checked and displayed in advance. Therefore, it is possible to easily find any part which needs to be corrected before actually starting the mounting of the components.

Still further, operation requirements for one or more inspecting devices for inspecting the mount state of the electronic components are preferably received. By using the information about the mounting positions included in the circuit board data as inspection position information, 3D graphics data is generated for displaying a component assignment for each inspecting device, an order of inspecting the components, and a possible range which is interfered by a facility operation in 3D.

As such, by applying the method according to the second aspect of the present invention to the inspecting device, the inspection state of the circuit board having components mounted thereon can be displayed in 3D together with the operation requirements for the inspecting device to be used. Thus, it is possible to virtually check a defective condition in the inspection state by a board inspection process without using any prototype of the actual board, and the check can be made more reliably.

A third aspect of the present invention is directed to an apparatus for checking the mount quality of a circuit board having components mounted thereon by a mounting device. The apparatus includes:

a data input unit for receiving board data corresponding to a circuit board used for a designed circuit, component data corresponding to components to be used, and position information corresponding to mounting positions of the respective components;

a circuit board information storage having information corresponding to available boards previously stored therein, and for outputting board information corresponding to the board data;

a component information storage having information corresponding to available components stored therein, and for outputting component information corresponding to the component data;

a mounting process requirement storage having requirements for respective available mounting process stored therein;

a mounting device requirement storage having requirements for operations of the respective available mounting devices;

an applied mount requirement input unit for inputting mount requirements specifying a mounting process and a mounting device to be used in manufacturing the circuit board; and a design analyzer for checking, based on the requirements for the mounting process and the mounting device, whether target mount quality and productivity can be satisfied by the circuit board manufactured based on the board information, the component information, and the position information under the mount requirements.

According to the apparatus of the third aspect, the requirements are registered in advance for the respective mounting processes and mounting devices. Therefore, when the mounting process to be used and/or the operation requirements for the mounting device is/are changed, the change is easily reflected onto the design check. Therefore, consideration of the mount quality during the mounting procedure reduces the number of quality checks onto the actual prototype, and the circuit board that satisfies the target quality can be designed in the early stage of designing.

Preferably, each of the requirements for the mounting process and the mounting device is changed based on the performance of the mount quality when the circuit board is actually manufactured.

As such, the performance of the circuit board actually manufactured is fed back to the requirements, thereby quickly and correctly allowing the designer to design a circuit board with less of a defective condition at the time the next circuit is designed.

Also, when the mount quality is rechecked after the circuit board is changed, the design analyzer preferably checks only a predetermined area corresponding to a changed part or a part in which an error occurred.

As such, only a range corresponding to a portion changed or a portion at which an error occurred is rechecked. Such a limited-area recheck requires less time than an entire-board recheck.

Here, according to the apparatus of the third aspect of the present invention, the design analyzer includes:

a circuit board data storage for receiving and storing circuit board data used in the mounting device, where the circuit board data includes information corresponding to mounting positions and shapes of the components mounted on the circuit board and a shape of the circuit board;

a facility operation data storage for receiving and storing facility operation data related to the mounting device, where the facility operation data includes information corresponding to a type and falling position of a suction nozzle to be used, an allowable distance between the components, and an allowable operation range;

a data selector for selecting a circuit board from the stored circuit board data to be displayed in 3D;

a data generator for generating 3D graphics data for displaying outer shapes of the circuit board and the components at respective mounting positions by retrieving, from the stored facility operation data, data required for the circuit board data of the selected circuit board, and for calculating data representing a state of the circuit board having the components mounted thereon; and a data display unit for displaying an image based on the generated 3D graphics data.

With such a structure, the mount state of the circuit board can be displayed in 3D with the components mounted thereon based on the received mount data (circuit board data and facility operation data), and the operation requirements for the mounting device to be used can also displayed in 3D. Thus, the mount data can be virtually checked without using any prototype of the actual board, and thus, the mount data can also be more reliably evaluated. By reducing the workload of making a prototype, the electronic components can be mounted within a shorter period of time and at a lower cost. Moreover, the method according to the second aspect of the present invention is also applicable to a case where the components are mounted by a plurality of mounting devices.

Furthermore, the data generator preferably generates the 3D graphics data for displaying, in 3D, the positions of the components after they are mounted, a component assignment for each mounting device, an order of mounting the components, and a state of any component being sucked by a suction nozzle. Also, the display unit displays a mounting operation by successively displaying moving images according to the order of mounting the components.

By displaying the mount state of the circuit board by using the above information and display process, the mount data can be checked more quickly and reliably.

Still further, the design analyzer further preferably includes a data editor for changing the stored circuit board data or the stored facility operation data with regard to component information, mounting position information, a type or falling position information of a suction nozzle, and for then storing the changed data.

Still further, the design analyzer further preferably includes a data history manager for storing a storage time of the changed data as history and storing the 3D graphics data generated based on the changed data in relation to the history. Also, when an image is displayed based on 3D graphics data newly generated from the changed data, the data display unit searches the 3D graphics data before the changed data from the stored history, and displays the image based on the 3D graphics data after the change and the 3D graphics data before the change to show a difference in the mount state after the change.

As such, by displaying and checking the changed mount data through a 3D image, the mount data can be changed and checked more quickly and correctly.

Still further, when the component cannot be mounted at the mounting position specified in the circuit board data, the data generator preferably generates an error-state 3D graphics data for representing a defective part or the cause thereof Also, the data display unit displays the image based on the 3D graphics data and the error-state 3D graphics data.

As such, the defective part in the mount data can be checked and displayed in advance. Therefore, it is possible to easily find any part which needs to be corrected before actually starting the mounting of the components.

Still further, the facility operation data storage further preferably receives operation requirements for one or more inspecting devices for inspecting the mount state of the electronic components, and the data generator further generates 3D graphics data for displaying a component assignment for each inspecting device, an order of inspecting the components, and a possible range which is interfered by a facility operation in 3D by using the information about the mounting positions included in the circuit board data as inspection position information.

As such, by applying the method of the present invention to the inspecting device, the inspection state of the circuit board having components mounted thereon can be displayed in 3D together with the operation requirements for the inspecting device to be used. Thus, it is possible to virtually check a defective condition in the inspection state without using any prototype of the actual board, and the check can be made more reliably.

Typically, the mount quality check method and mount state display method according to the above first and second aspects of the present invention are realized by a computer device executing a predetermined program in which the procedure of each method is programmed. The predetermined program may be previously stored in a storage device (ROM, RAM, hard disk, etc.) incorporated in the computer device, or may be loaded into the computer device through a program-writable recording medium (CD-ROM, floppy disk, etc.)

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram illustrating one example of CAD data supplied to the CAD data input unit 1;

FIG. 4 is a diagram showing one example of board information stored in a circuit board information storage 3;

FIG. 5 is a diagram showing one example of component information stored in a component information storage 4;

FIG. 6 is a diagram showing one example of requirements stored in a mount scheme (process) requirement storage 6;

FIG. 7 is a diagram showing one example of the requirements stored in a mounting device requirement storage 7;

FIG. 8 is a diagram showing one example of an applied requirement list in a design analyzer 8;

FIG. 9 is a diagram showing one example of a specific layout image formed by the design analyzer 8;

FIG. 11 is a diagram showing one example of the mount quality check results outputted from a check result output unit 9;

FIG. 12 is a diagram showing another example of the requirements stored in the mounting device requirement storage 7;

FIG. 13 is a diagram showing one example of mount quality performance results of an actually-manufactured circuit board;

FIG. 16 is a diagram showing one example of circuit board data supplied to a circuit board data storage 141;

FIG. 17 is a diagram showing facility operation data supplied to a facility operation data storage 142;

FIG. 18 is a diagram showing one example of a list of the circuit board data;

FIG. 21 is a diagram showing another example of the circuit board data supplied to the circuit board data storage 141;

FIG. 22 is a diagram showing another example of the facility operation data supplied to the facility operation data storage 142;

FIG. 32 is a diagram showing one example of history management information managed by the data history manager 147;

FIG. 33 is a diagram showing one example of circuit board data changed by the circuit board data editor 145;

FIG. 34 is a diagram showing another example of the history management information managed by the data history manager 147;

DESCRIPTION OF THE PREFERRED EMBODIMENTS (First Embodiment)

Figure 1:
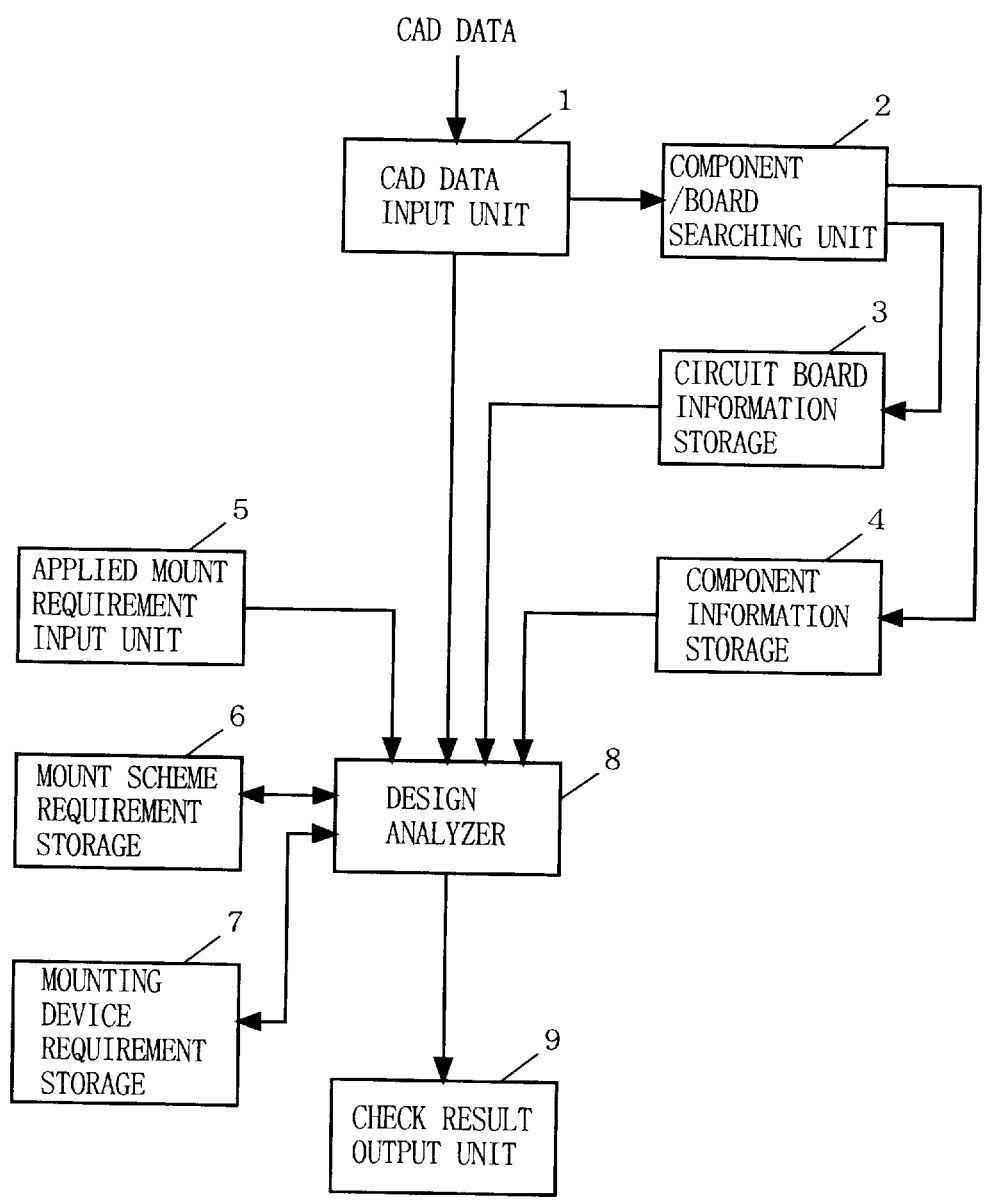
FIG. 1 is a block diagram showing the structure of an apparatus using a method of checking the mount quality of a circuit board according to a first embodiment of the present invention.

FIG. 1 is a block diagram showing the structure of an apparatus using a method of checking the mount quality of a circuit board according to a first embodiment of the present invention. In FIG. 1, the mount quality check apparatus according to the first embodiment includes a CAD data input unit 1, a component/board retriever (component/board searching unit) 2, a circuit board information storage 3, a component information storage 4, an applied mount requirement input unit 5, a mount scheme (process) requirement storage 6, a mounting device requirement storage 7, a design analyzer 8, and a check result output unit 9.

With reference to FIG. 1, described first are the general outlines of the components included in the mount quality check apparatus according to the first embodiment.

The CAD data input unit 1 is supplied with CAD data corresponding to a circuit board designed under a CAD system (not shown). This CAD data includes board data, such as a name and a dimension of the board, and component data such as a name and a mounting position of each component. The CAD system used for designing is not specifically restrictive as long as the system can output data corresponding to the board data and the component data. The component/board retriever 2 retrieves the board data and the component data from the CAD data, and outputs the retrieved board and component data to the circuit board information storage 3 and the component information storage 4, respectively. The circuit board information storage 3 has information about the board designs (hereinafter, board information) for each of the various boards previously stored therein. Based on the board data given by the component/board retriever 2, the circuit board information storage 3 outputs the required board information to the design analyzer 8. The component information storage 4 has information about the component design (hereinafter, component information) for each component previously stored therein. Based on the component data given by the component/board retriever 2, the component information storage 4 outputs the required component information to the design analyzer 8. The applied mount requirement input unit 5 is supplied with mount requirements corresponding to how the designed circuit board is to be manufactured and under what circumstances it is to be manufactured, and an instruction about which check item is to be checked. The mount process requirement storage 6 has use requirements for each of the various mount processes previously stored therein. The mounting device requirement storage 7 has operation requirements for each of the various mounting devices previously stored therein. The design analyzer 8 is supplied with the above-described board information, component information, mount requirements, and instructions, and the design analyzer 8 refers to the above-described requirements. The design analyzer 8 then analyzes whether the designed circuit board can be realized under the mount requirements, and obtains useful results for supporting optimal circuit board designing. The check result output unit 9 outputs the analysis results by displaying an image on a screen or, by providing a printout to feed the analysis results obtained by the design analyzer 8 back to the designer.

With further reference to FIGS. 2 through 13, described next is the method of checking the mount quality of the circuit board carried out by the above-structured mount quality check apparatus.

Figure 2:
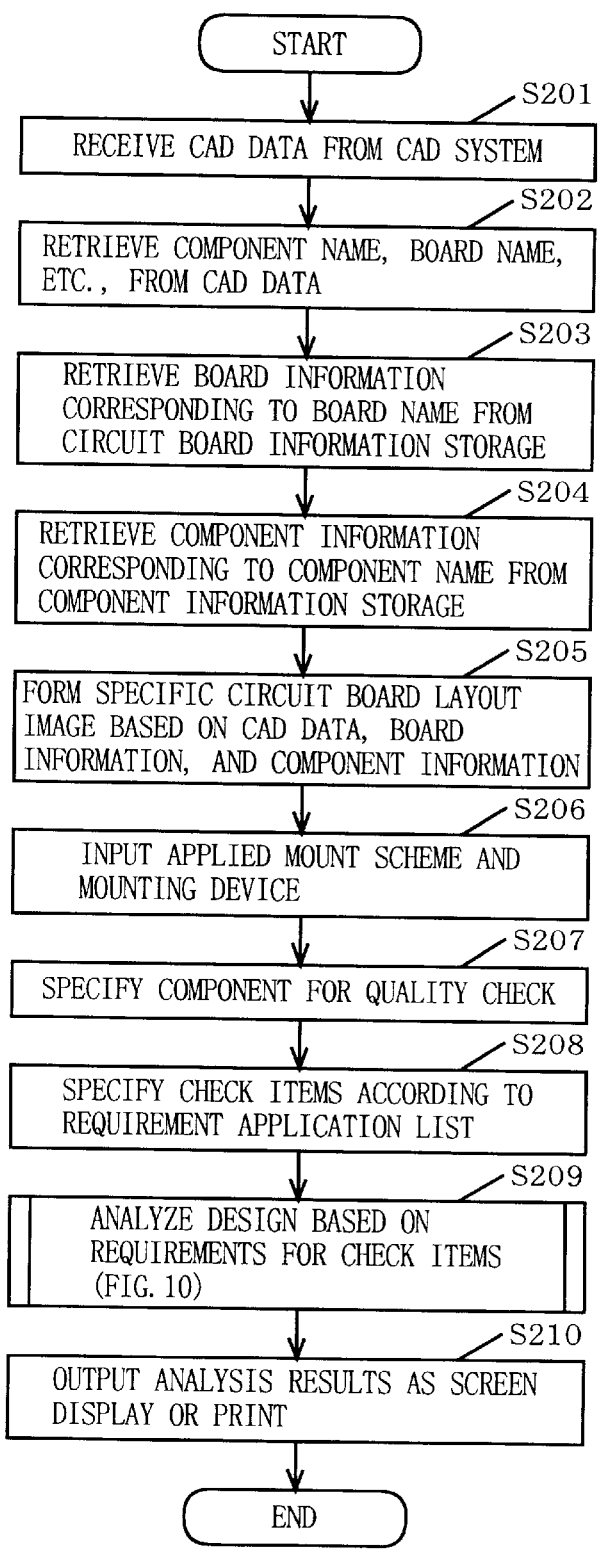
FIG. 2 is a flowchart showing the procedure of the method of checking the mount quality of the circuit board according to the first embodiment of the present invention.

FIG. 2 is a flowchart showing the procedure of the mount quality check method according to the first embodiment of the present invention.

First, the CAD data input unit 1 is supplied with CAD data corresponding to the circuit board designed under the CAD system (step S201). One example of the CAD data is illustrated in FIG. 3. As shown in FIG. 3, the CAD data includes for each component used in the circuit: a list 31 containing a circuit number, a component name, a mounting position (XY coordinates), and other information; a list 32 containing a board name of the board to be used, board dimensions (lengths and width measurements), and other information; a list 33 containing a land shape and a printed mask shape both represented by code names for each circuit number; and a list 34 containing a mark shape for a positional correction of the component to be used represented by a code name, and other data. The CAD data also includes information about the detailed shape of the circuit board, such as its actual shape or perforations therein, as variable-length data. This variable-length data can be represented by using any shape representation format, generally in a Gerber format. Some existing CAD systems may not be capable of generating the list 33, the list 34, or the data corresponding to the detailed shape of the circuit board. If such a CAD system's CAD data is used for the mount quality check, only the available items in the lists 31 and 32 are used for the analysis.

Once the CAD data is supplied to the CAD data input unit 1, the component/board search unit 2 searches the list 31 and the lists 32 to 34, and retrieves therefrom the component name, the board name and the land/mask shape code, respectively (step S202). The component/board search unit 2 then outputs the found information to the circuit board information storage 3 and the component information storage 4.

The circuit board information storage 3 refers to the board name and the land/mask shape code given by the component/board search unit 2 in order to retrieve and output the board information corresponding thereto to the design analyzer 8 (step S203). The circuit board information storage 3 has the board information for each board previously stored therein. One example of such board information is shown in FIG. 4. As shown in FIG. 4, the board information includes: a list 41 containing board material information for each board (name) registered; a list 42 containing a dimension of the shape (length and width measurements) for each land shape and printed mask shape; and a list 43 containing a mark dimension (length and width measurements) for each position mark registered. Here, similar to the above board shape information, the actual land shape and printed mask shape can be represented by using the Gerber format.

For example, the board material "glass epoxy" obtained from the board name "BRD1002PC", and the height "1.5 mm" and the width "0.8 mm" obtained from the land shape code "LND1608R" in FIGS. 3 and 4 are outputted as the board information from the circuit board information storage 3 to the design analyzer 8.

The component information storage 4 refers to the component name given by the component/board search unit 2 in order to retrieve and output the component information corresponding thereto to the design analyzer 8 (step S204). The component information storage 4 has the component information for each component previously stored therein. One example of such component information is shown in FIG. 5. As shown in FIG. 5, the component information includes a list 51 containing a classification code for specifying the shape or packaging of each component (name) registered; a list 52 containing the outer dimension, the number of leads, and a lead pitch for each component shape code; a list 53 containing, for each packaging code, a type of packaging, a tape width, and a component pitch, and other items which are registered. The components which are equal in shape and packaging but which are differed in internal function value are provided with the same component shape and the same packaging code, thereby reducing the amount of information in the lists 52 and 53.

For example, the component shape (the height "1.6 mm" and the width "0.8 mm", for example) and the packaging (the type "PAPER" and the tape width "8.0 mm", for example) obtained from the component name "ERJ1GEYJ1" in FIGS. 3 and 5 are outputted as the component information from the component information storage 4 to the design analyzer 8.

Of the CAD data shown in FIG. 3, the mounting position of each component and the dimension of the circuit board to be used are directly outputted from the CAD data input unit 1 to the design analyzer 8.

Based on the supplied data and information, the design analyzer 8 can form a specific layout image of the circuit board having the components mounted thereon (step S205).

Prior to an analysis of the design, the applied mount requirement input unit 5 is supplied with mount requirements by the designer, and the applied mount requirement input unit 5 in turn forwards the mount requirements to the design analyzer 8 (step S206). These mount requirements are generally classified into a mounting process requirement and a mounting device requirement. The mounting process requirement includes soldering processes, a soldering material to be used, a circuit board processing process, and a circuit board checking process. The mounting device requirement includes a factory name and a mounting device name to be used.

For example, "flow" as the soldering process, "soldering material A" as the soldering material, "B factory" as the factory name, and "MV2" as the mounting device are inputted to the applied mount requirement input unit 5.

Described next are the mounting process use requirements previously stored in the mount process requirement storage 6. FIG. 6 is a diagram showing one example of requirements stored in the mount process requirement storage 6.

As shown in FIG. 6, soldering process requirements are contained in a list 61, and circuit board processing requirements are contained in a list 62. Each list is provided for each factory. Each requirement that appears in the list (Requirement A, Requirement B, etc.) has a design reference value data set in a list 63. In the list 61, the requirement for a distance between components, test points, or a component and a test point is defined for each soldering process, each soldering material, and each board material. The actual setting requirement value (check value) are provided by the list 63 containing the design reference value data for each requirement. Similarly, in the list 62, the requirement for a dead space between a component (test point) and a cut line is defined for each cutting process to divide the board. Needless to say, other requirements not shown in FIG. 6 may be freely set as required.

Described next are mounting device operation requirements previously stored in the mounting device requirement storage 7. FIG. 7 is a diagram showing one example of requirements stored in the mounting device requirement storage 7.

As shown in FIG. 7, requirements about the components which define whether they are mountable or not by the mounting device are contained in a list 71, and those requirements corresponding to a distance between the mountable components are contained in a list 72. Each list is provided for each factory. Each requirement that appears in the list (Requirement A, Requirement B, etc.) has design a reference value data set in a list 73. In the list 71, whether the component is mountable or not is defined for each mounting device type and each component type. The actual setting requirement value (check value) are provided from the list 73 containing the design reference value data for each requirement. Similarly, in the list 72, the requirement for a distance between the components is defined for each component type mountable by the mounting device. Needless to say, other requirements not shown in FIG. 7 may be freely set as required.

The applied mount requirement input unit 5 is then supplied by the designer with an instruction for checking a specific component on the circuit board (step S207), and is also supplied with an instruction for checking the specific component as to a specific check item on a requirement application list (described later) (step S208). The applied mount requirement input unit 5 then forwards these instructions to the design analyzer 8.

Here, for satisfying the mount quality by using the above previously set requirements, the design analyzer 8 has a requirement application list previously stored therein that has set which requirement should be applied to the specific check item. FIG. 8 is a diagram showing one example of a requirement application list 81 included in the design analyzer 8. The example of FIG. 8 shows which check item in FIGS. 6 and 7 should be applied when the component mounting position, which is a typical item that should be satisfied for high mount quality, is checked to see if the mounting position is shifted or not, or when the soldering state is checked to see if a bridge or inversion does not occur.

The design analyzer 8 then checks the specified component and check item to see if the designed circuit board satisfies each requirement based on the requirements of the mounting process and the mounting device to be used. Such a check includes, for example, analyzing the specific layout image including the actual land shape, mask shape, and pattern wiring formed based on the CAD data and the other information.

Figure 10:
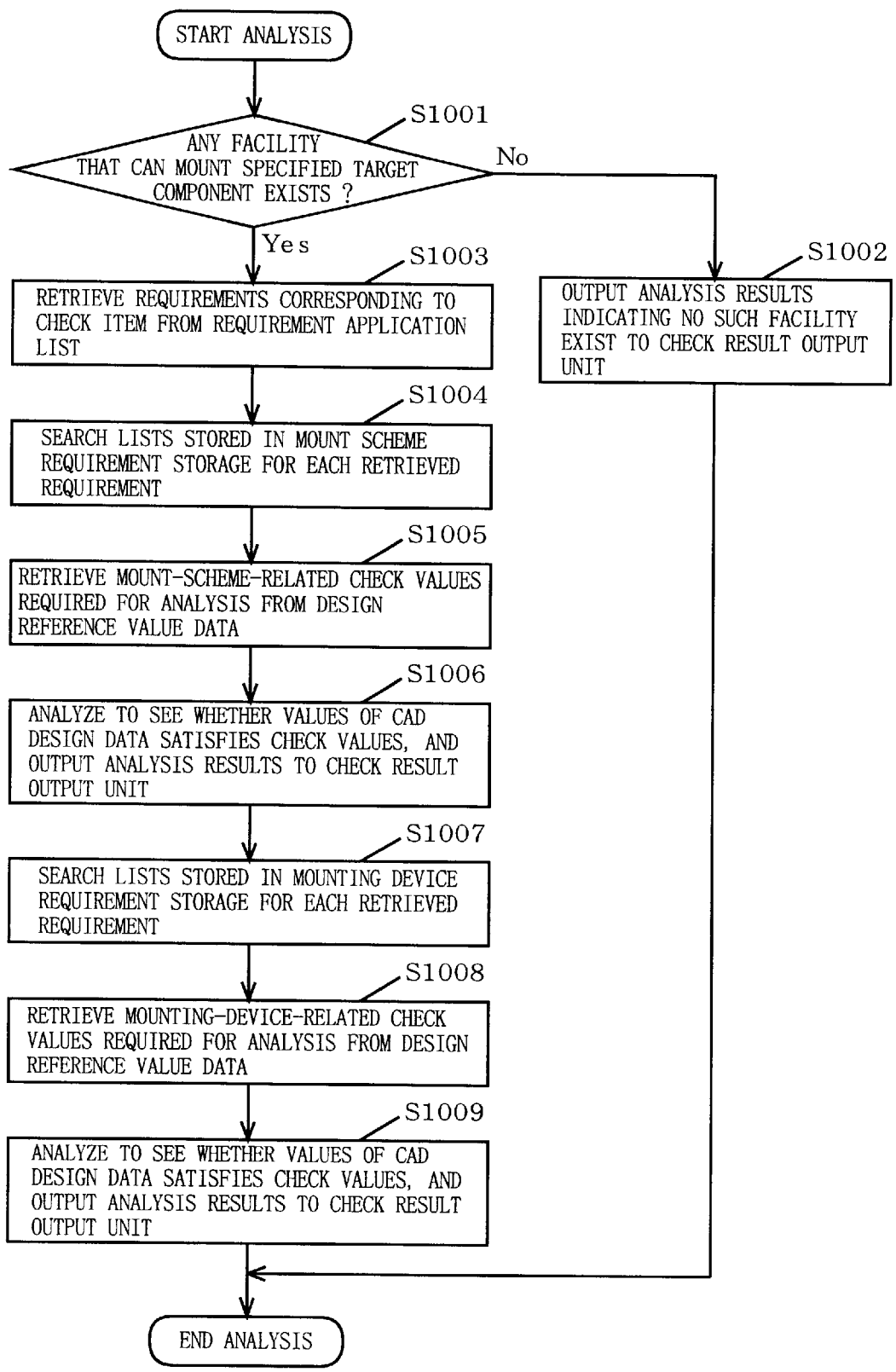
FIG. 10 is a flowchart showing in detail the analyzing processing carried out by the design analyzer 8.

With reference to examples shown in FIGS. 9 and 10, described below is an analysis process carried out by the design analyzer 8. FIG. 9 is a diagram showing one example of the specific layout image formed by the design analyzer 8. FIG. 10 is a flowchart showing in detail the analysis process (step S209 of FIG. 2) carried out by the design analyzer 8.

Assume herein that the designer gives an instruction for checking the quality of the mounting position of a chip 91 and a chip 92 arranged on a circuit board as shown in FIG. 9. In the example of FIG. 9, also assume that the distance between the two chips 91 and 92 is designed to be 0.4 mm. Also assume that the mount requirements supplied in step S206 are "A factory", "flow", and "board material A".

In this case, as shown in FIG. 10, the design analyzer 8 determines whether there is any facility that can mount the component specified by the designer (step S1001). In this example, it is determined whether any facility that can mount the chips 91 and 92 on the board material A through the flow process exists in the A factory. Here, if such a facility does not exist, the design analyzer 8 outputs the analysis result indicating that no such facility exists, to the check result output unit 9, (step S1002). If such a facility exists, on the other hand, the design analyzer 8 retrieves the requirements corresponding to the check item in the requirement application list 81 (step S1003). In this example, the check item is "component mounting position". Therefore, the design analyzer 8 retrieves the requirements as to "distance between components", "distance between test points", "land area", and others from the requirement application list 81.

The design analyzer 8 then searches, for each of the retrieved requirements, the lists 61 and 62 stored in the mount process requirement storage 6 (step S1004), and retrieves the mount process-related check values required for analysis from the list 63 (step S1005). In this example, for the soldering material A, based on the requirements "chip", "A factory", "flow", "board material A", and "the distance between components", the check value "equal to or larger than 0.5 mm" is retrieved. The design analyzer 8 then analyzes whether each value of the CAD design data satisfies the retrieved check value and in turn outputs the analysis result to the check result output unit 9 (step S1006). In this example, the distance between the two chips 91 and 92 is designed to be "0.4 mm". Therefore, the design analyzer 8 outputs the analysis result indicating that the value does not satisfy the check value "equal to or larger than 0.5 mm".

The design analyzer 8 then searches the lists 71 and 72 stored in the mounting device requirement storage 7 for each retrieved requirement (step S1007), and retrieves the mounting-device-related check value required for analysis from the list 73 (step S1008). In this example, the chip can be mounted when the mounting device (facility) is "MV2", and the check value "equal to or larger than 0.3 mm" is retrieved. The design analyzer 8 then analyzes whether each value of the CAD design data satisfies the retrieved check value, and in turn outputs the analysis result to the check result output unit 9 (step S1009). In this example, the distance between the two chips 91 and 92 is designed to be "0.4 mm". Therefore, the design analyzer 8 outputs the analysis result indicating that the value satisfies the check value "equal to or larger than 0.3 mm".

As stated above, the analysis process is performed for the mount process and the mounting device. Supplied with the analysis results, the check result output unit 9 generates mount quality check results based on the analysis results, and outputs them as a screen display or a printout (step S210). One example of such mount quality check results outputted from the check result output unit 9 is shown in FIG. 11. As shown in FIG. 11, the analysis is carried out as many times as possible under the requirements as specified by the designer, and the respective results are shown. As such, the plurality of analysis results enable the designer to easily see what measure can be taken. The mount quality check results outputted from the check result output unit 9 are not restricted to show the plurality of analysis results as shown in FIG. 11, and may show only the analysis results under the mount requirements as specified by the designer. In the example of FIG. 11, the design of the chips 91 and 92 will fail to achieve the mount quality with the soldering material A in view of the mount process, but the design of the chips 91 and 92 will have no problem with the soldering material B. Therefore, from this check results, the designer can take a measure to change the distance between the chips to 0.5 mm, or alternatively take a measure to specify that the soldering material B is to be used in manufacturing.

The mount quality check results outputted from the check result output unit 9 are not restricted to take the data list format as shown in FIG. 11, and may be displayed as a two- or three-dimensional board layout image. In such a board layout image, a component where a quality error occurs can be displayed in a different color or as a blinking image. By selecting any component on the board layout image, information about the component, such as a product number, cost, and fraction defective, may be displayed like a pop-up menu. A mount state displaying method and apparatus for displaying the mount quality check results in a three-dimensional board layout image will be described later in other embodiments.

As described above, in the method and apparatus for checking the mount quality of the circuit board according to the first embodiment of the present invention, the requirements are registered previously for each mounting process and each mounting device. Therefore, if the mounting process to be used, the operation requirement of the mounting device, and others are changed, such a change can be easily reflected on the design check. Therefore, consideration of the mount quality during the mounting procedure reduces the number of quality checks onto the actual prototype, and the circuit board that satisfies the target quality can be designed in the early stage of designing.

In the above embodiment, the list 71 of FIG. 7 is exemplarily used to contain the mountable component requirements stored in the mounting device requirement storage 7. Alternatively, a list 121 further containing a mount cycle (tact) time as shown in FIG. 12 may be used. With this list 121, productivity (mount cycle time) can also be evaluated at the time of checking the mount quality of the circuit board. In the example of FIG. 9, the total mount cycle time for the chips 91 and 92 can be known from the list 121 as "0.2 sec". In addition to the above mount cycle time, by taking fixed costs such as facility amortization and labor cost into consideration, the mount cost incurred when the circuit board is actually manufactured can be calculated.

Thus, the mount cycle time and the material cost, which vary according to changes in the number and type of components due to a design change, can be checked. Therefore, a lower-cost circuit having more productivity and satisfying the requirements for the target mount quality can be quickly designed.

In general, the mounting device uses a camera recognition process, for example, to accurately correct the position of the suction nozzle for holding a component, and the mounting device also changes the operation speed to ensure an appropriate operation in accordance with the size of the component. Therefore, so-called NC data for enabling the mounting device to operate has to be able to specify the mounting operation speed and the size of the component. The NC data is generated by a CAM (Computer Aided Manufacturing) system, which generally holds information corresponding to the lists 51 to 53 stored in the component information storage 4 and information corresponding to the list 71 or 121 stored in the mounting device requirement storage 7. In the mount quality check apparatus according to the present invention, such information is provided by the CAM system side, thereby avoiding data redundancy and reducing the workload.

Consider a case where, based on the results obtained from the mount quality check according to the present invention, the distance between the components 91 and 92 shown in FIG. 9 is changed to "0.5 mm", and the mount quality performances obtained after the change are as shown in FIG. 13. In this case, it is preferable to analyze the mount quality performance, or, more specifically, to analyze any defect that occurred more frequently than a predetermined value and review the check value in the design reference value data in order to reflect the mount quality performance onto the requirements. For example, in FIG. 13, consider a case where analysis is carried out on mount shifts that occurred ten times, and the results are obtained where the distance between the components is not enough. In this case, of the design reference value data (the list 63) stored in the mount scheme requirements storage 6, the distance between the chips is changed from "0.5 mm" to "0.6 mm" for correction.

Also, as described above, when the distance between the chips 91 and 92 is changed to "0.6 mm", it is assumed that the components affected by this change may exist only in the vicinity of the chips 91 and 92. Therefore, in this case, the mount quality is rechecked only in that vicinity (for example, an area within a predetermined distance of the component which was changed). Such a limited-area recheck requires less time than an entire-board recheck.

(Second Embodiment)

Described next is a mount state displaying method and apparatus for displaying a three-dimensional board layout image representing the mount quality check results. Typically, the apparatus for realizing the mount state display method is included in the design analyzer 8 of FIG. 1. A three-dimensional graphics data generated in the apparatus is displayed on the check result output unit 9.

Figure 14:
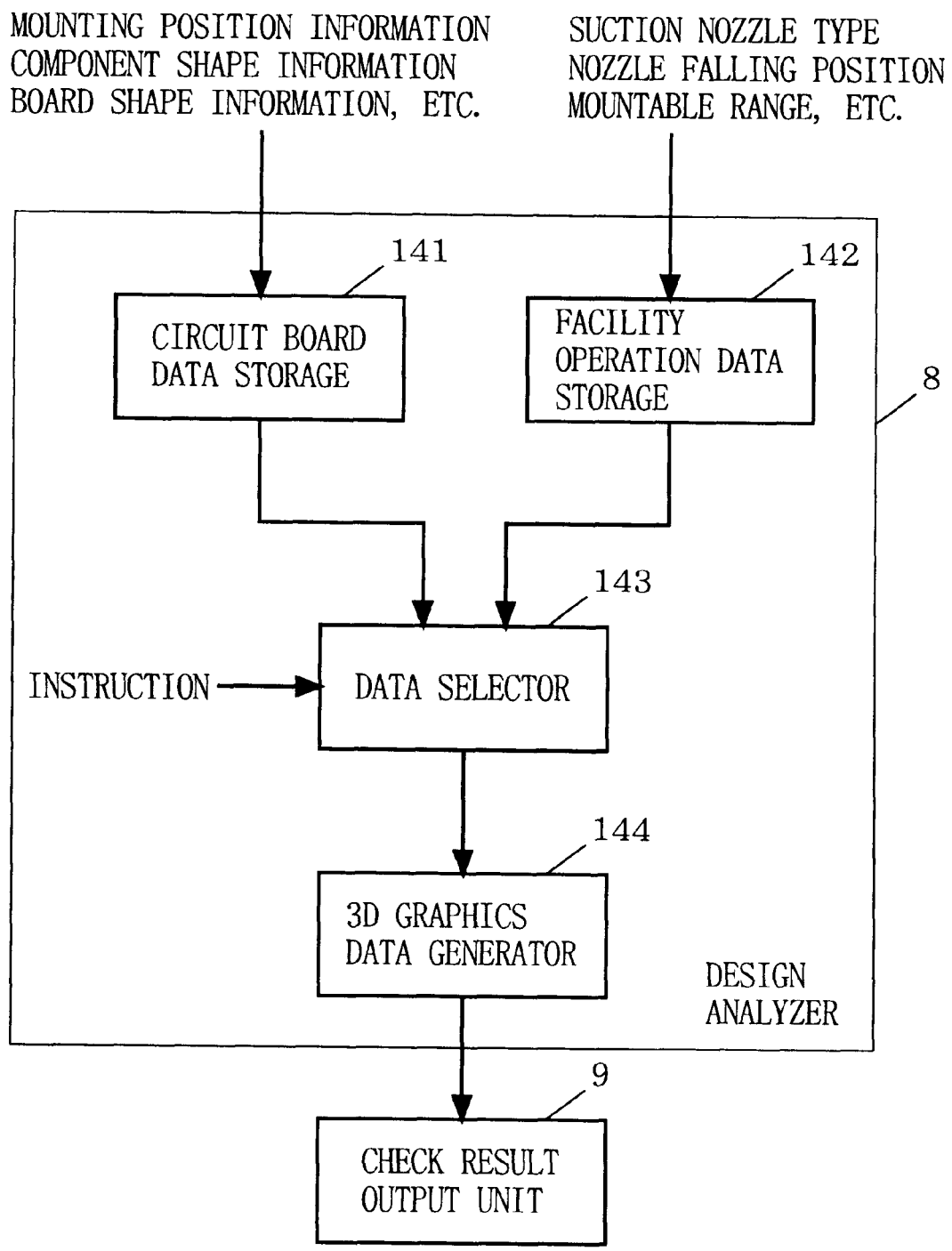
FIG. 14 is a block diagram showing the structure of an apparatus using a method of displaying the mount state on the circuit board according to a second embodiment of the present invention.

FIG. 14 is a block diagram showing the structure of the apparatus using the method of displaying the mount state on the circuit board according to the second embodiment of the present invention. In FIG. 14, the mount state display apparatus according to the second embodiment includes a circuit board data storage 141, a facility operation data storage 142, a data selector 143, and a three-dimensional (3D) graphics data generator 144.

With reference to FIG. 14, described first are the general outlines of each of the components of the mount state display apparatus according to the second embodiment.

The circuit board data storage 141 stores, for each circuit board, data related to the circuit board, such as information corresponding to the mounting position and the shape of each component and information about the shape of the circuit board. The facility operation data storage 142 stores, for each facility and component, data corresponding to facility operations, such as the operation requirement information of the mounting device including the type and the falling (placement) position of a suction nozzle and an allowable mountable range for each of the components. The data selector 143, by following a given instruction, searches a plurality of circuit board data stored in the circuit board data storage 141 to retrieve the data related to the circuit board to be displayed in 3D. The data selector 143 also searches the facility operation data stored in the facility operation data storage 142 to retrieve the facility operation data for the component included in the found circuit board data. The 3D graphics data generator 144 calculates data representing the state of the circuit board after mounting based on the data retrieved by the data selector 143, and then generates 3D graphics data for displaying the outer shapes of the circuit board and the components at the respective mounting positions. The 3 D graphics data generator 144 also generates 3D graphics data that allows for distinguishable representations of component assignments and the order of mounting the components by color or by a supplemental line, or for 3D graphics data representing the state of the component being mounted by the suction nozzle. The check result output unit 9 is similar to that described in the above first embodiment, but it further includes such processing functions as a rotation of the graphics and a zoom-in/out of the graphics which are added in order to ensure that the graphics represented in 3D can be thoroughly checked.

With further reference to FIGS. 15 to 20, specifically described is the mount state display method carried out by the above structured mount state display apparatus.

Figure 15:
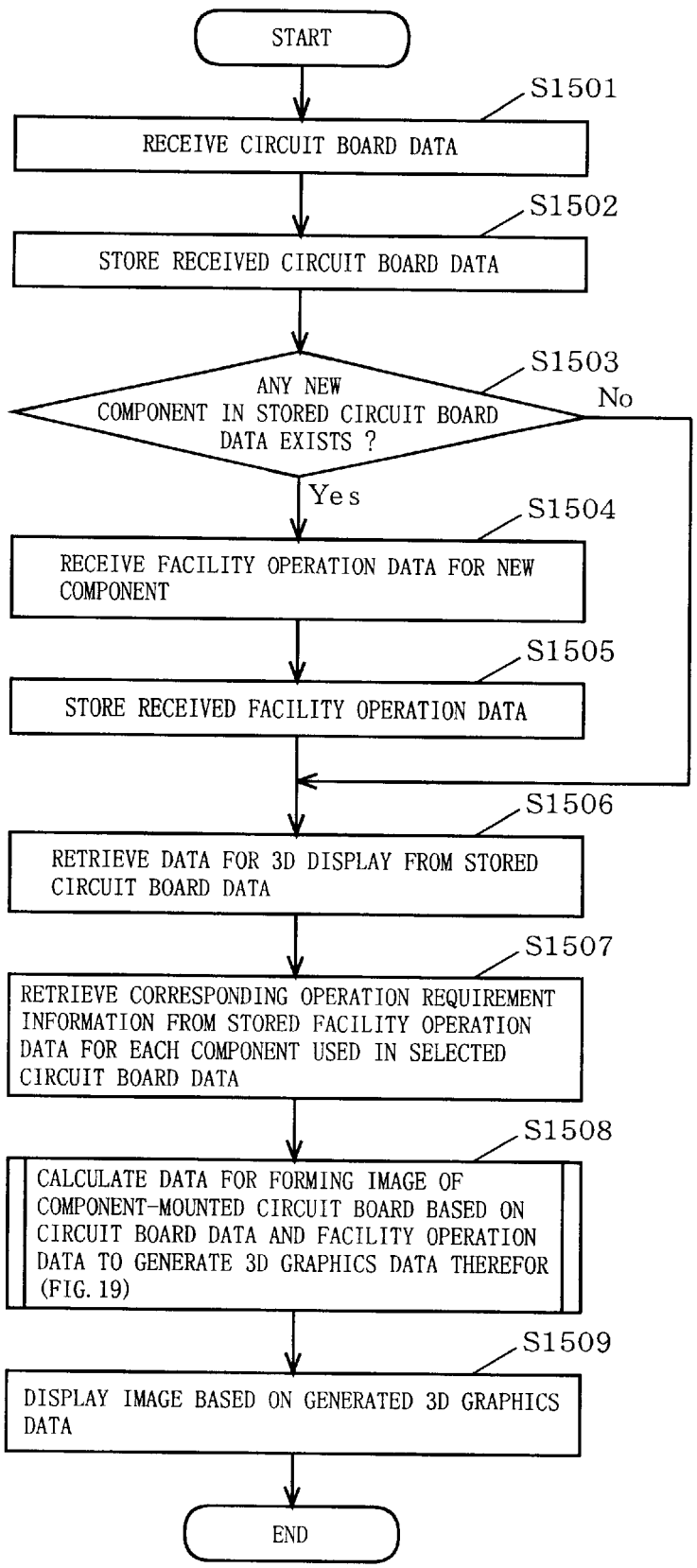
FIG. 15 is a flowchart showing the procedure of the method of displaying the mount state on the circuit board according to the second embodiment of the present invention.

FIG. 15 is a flowchart showing the procedure of the method of displaying the mount state on the circuit board according to the second embodiment of the present invention.

The circuit board data storage 141 is supplied with required circuit board data by the CAD data input unit 1, the circuit board information storage 3, and the component information storage 4 (refer to FIG. 1) (step S1501). One example of circuit board data is shown in FIG. 16. As shown in FIG. 16, the circuit board data includes: a mounting position information list 161 containing the board number, component name, and mounting position (XY coordinates); a circuit board shape information list 162 containing the name and dimensions (length and width measurements) of the circuit board to be used; a correspondence list 163 indicating the correspondence between the respective component names and the component shape codes; and a component shape information list 164 containing actual dimension values of each component for each component shape code. Many mount components may be similar in their outer shape to each other but vary in their internal functional values, such as their resistance values. Therefore, the component shape is managed by the list 164 by providing the component shapes with respective component shape codes, which are defined by the list 163 for each component name. In the example shown in FIG. 16, the shape of the circuit board is approximated to a rectangular solid, but it may be defined by additional variable-length data to be approximated to a more actual shape. This variable-length data can be represented in any format, typically in the Gerber format, for example.

The supplied circuit board data is temporarily stored in the circuit board data storage 141 (step S1502). The circuit board data is normally stored in the same format as it is supplied. If the circuit board data has a plurality of formats, however, these formats may be converted into a predetermined unified format for storage, thereby simplifying the subsequent processing.

Then, the stored circuit board data is checked to determine whether there is any new component therein (step S1503). If any new component exists, its facility operation data is inputted from the applied mount requirement input unit 5, the mount process requirement storage 6, and the mounting device requirement storage 7 (refer to FIG. 1) to the facility operation data storage 142 (step S1504). If the circuit board data contains only the data of the components that have been used, their facility operation data has already been stored in the facility operation data storage 142. Therefore, no new input is required. An example of the facility operation data is shown in FIG. 17. As shown in FIG. 17, the facility operation data includes: a correspondence list 171 containing the correspondence between the respective component names and the component operation codes; an operation requirement information list 172 indicating, for each component operation code, operation requirements such as the type, the moving speed, and the falling position of the suction nozzle to be used; and a common operation requirement information list 173 containing a facility's specific features as applied to any component, such as an unmountable area on the circuit board and the allowable size of the nozzle type. As with the component shape, the operation requirements can be defined as one, and therefore they are provided with a component operation code for management in the list 172. The component operation codes are defined in the list 171 for each component name. The list 173 containing the features common to any component is, in general, not required to be changed once its inputted and stored. Therefore, inputting these features may be omitted after the first input of the facility operation data.

The names of the circuit board data vary for each circuit board. On the contrary, the facility operation data is applied to any circuit board, and therefore it is not provided with a data name. When the facility operation data is managed as a file, any additional input is registered in that file stored in the facility operation data storage 142.

The supplied facility operation data is temporarily stored in the facility operation data storage 142 (step S1505). The facility operation data is normally stored in the same format as it is supplied. If the facility operation data has a plurality of formats, however, these formats may be converted into a predetermined unified format for storage, thereby simplifying the subsequent processing.

Then, a circuit board to be displayed in 3D is selected from the circuit board data stored in the circuit board data storage 141 (step S1506). This selection is made by selecting any one of circuit board data names that appear on a list 181 shown in FIG. 18, for example. Assume herein that the circuit board data "BRD0011" is selected. The contents of the selected circuit board data are read out. For the component included in the data, by referring to the component name as a key, the operation requirement information is retrieved from the facility operation data stored in the facility operation data storage 142 (step S1507). By way of example, with reference to FIGS. 16 and 17, for the component name "ERJ3EYG10" included in the circuit board data "BRD0011", the circuit board data including the component shape (Y direction "1.6 mm", X direction "0.8 mm") and the facility operation data including the suction nozzle "S" and the nozzle falling position "0.5 mm" are retrieved.

Figure 19:
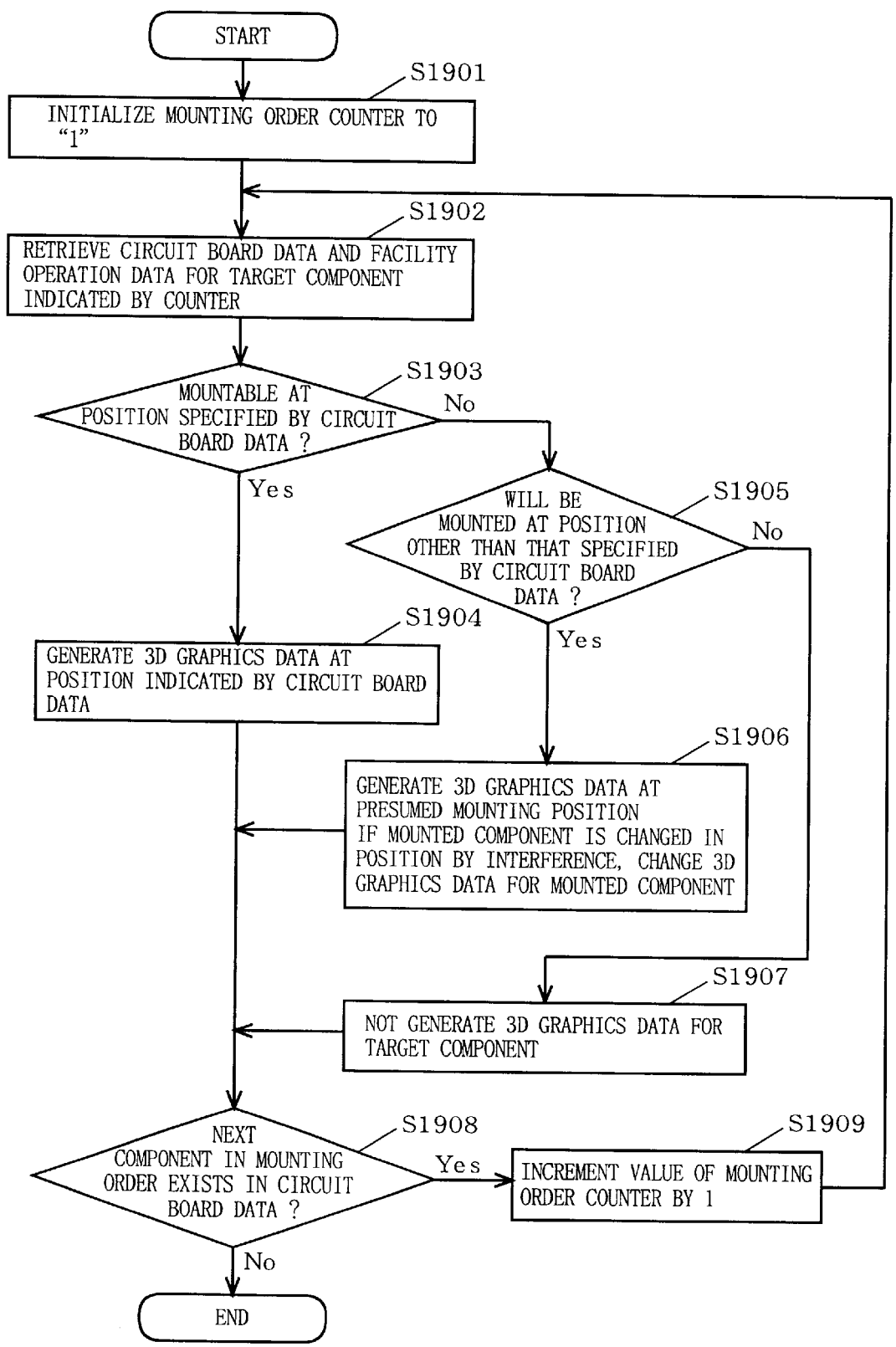
FIG. 19 is a flowchart showing in detail the procedure carried out by a 3D graphics data generator 144.

For displaying a circuit board image in 3D with the components mounted thereon based on the retrieved data, 3D graphics data is generated (step S1508). FIG. 19 is a flowchart showing in detail the processing carried out by the 3D graphics data generator 144 in step S1508.

With reference to FIG. 19, the 3D graphics data generator 144 uses a counter to initialize the order of mounting the components to carry out the following processing in the order of actually mounting the components on the circuit board (steps S1901, S1908, and S1909).

The 3D graphics data generator 144 retrieves the circuit board data, such as the mounting position and the shape of the circuit board, and the facility operation data, such as the nozzle for use and the nozzle falling position, for a component indicated by the counter which is to be processed (hereinafter, target component) (step S1902). The 3D graphics data generator 144 then determines whether the target component can be mounted at the positional coordinates specified by the circuit board data (step S1903). Criteria for this determination includes whether the nozzle is correctly selected, whether there is a correct gap between the nozzle falling position and the board surface, and whether there is any object in the vicinity of the specified position. If it is determined in step S1903 that the target component can be mounted, the 3D graphics data generator 144 generates 3D graphics data for making 3D representation of the shape of the target component placed at the position as specified by the circuit board data (step S1904). By way of example, in the circuit board data "BRD0011" shown in FIG. 16, a component of the first mounting order "R101" can be mounted without a problem, and it can therefore be displayed as mounted at the specified position on the circuit board (refer to (a) of FIG. 20).

On the other hand, if it is determined in step S1903 that the target component cannot be mounted, the 3D graphics data generator 144 determines whether the target component will be possibly mounted at any other position than that specified by the circuit board data due to a component being mounted already (such as interference) (step S1905). By way of example, in the circuit board data "BRD0011" shown in FIG. 16, a component of the second mounting order "R102" is the same in its mounting position as the mounted component "R101" (erroneous data), and therefore the component of the second mounting order cannot be mounted on the board plane. In such a case, the 3D graphics data generator 144 predicts a possible mounting position in consideration of the mounted component, and generates 3 D graphics data for 3 D-displaying the outer shape of the target component at the predicted position (step S1906). Therefore, the target component "R102" is displayed as placed on the top of the component "R101" ((b) of FIG. 20). If interference will cause not only the target component but also any other mounted component to be changed in position, the 3D graphics data generator 144 regenerates 3D graphics data for the other mounted component.

If it is determined in step S1905 that the target component cannot be mounted at any other position than the position specified by the circuit board data, the 3D graphics data generator 144 does not generate 3D graphics data for displaying a image of the target component (step S1907). By way of example, in the circuit board data "BRD0011" shown in FIG. 16, a component of the third mounting order "C101" has the mounting position that falls short of the nozzle falling position by a distance 202 ((c) of FIG. 20). In this case, the component "C101" cannot be mounted at any other position, and therefore its 3D graphics data is not generated. Therefore, the displayed image is as shown in (b) of FIG. 20.

Based on the 3D graphics data generated in the above-described manner, an image is displayed on the check result output unit 9 (step S1509). The image displayed in 3D based on the circuit board data "BRD0011" is as shown in (d) of FIG. 20. The format of the 3D graphics data is determined in compliance with the check result output unit 9. Standard data formats include VRML, STL, and Open GL, which can be applied to commercially-available tools for carrying out the processing of the check result output unit 9. The check result output unit 9 may advantageously have a different-eye-view function or a zoom-in/out function applied to the 3 D graphics image for checking the virtual prototype.

In the present example, the lead shape is also displayed based on the lead-related information included in the list 164. If such lead-related information is not included, however, each component may be approximated to be a rectangular solid based only on the height information.

Next, consider a case in which a circuit board which is manufactured on a line where a plurality of mounting devices share a process of mounting components on the circuit board (hereinafter, "multi-device line") is to be displayed based on 3D graphics data. In this case, the circuit board data stored in the circuit board data storage 141 and the facility operation data stored in the facility operation data storage 142 are slightly different from those described with reference to FIGS. 16 and 17. With reference to FIGS. 21 and 22, these data are described below.

FIG. 21 is a diagram showing another example of circuit board data supplied to the circuit board data storage 141. As shown in FIG. 21, the circuit board data used for the multi-device line contains a mounting position information list 211 having the list 161 of the circuit board data shown in FIG. 16 (for a single mounting device) additionally provided with information about which mounting device mounts which component. Also, for each mounting device, the component mounting order is also defined.

FIG. 22 is a diagram showing another example of the facility operation data supplied to the facility operation data storage 142. As shown in FIG. 22, in the facility operation data, a list 221 corresponding to the list 171 of FIG. 17 is related to the mounting devices. Similarly, a list 222 corresponding to the list 172 of FIG. 17 and a list 223 corresponding to the list 173 of FIG. 17 are also related to the mounting devices. Furthermore, a line structure information list 224 defining the operation order of the mounting devices on the mounting line is newly provided.

In the examples shown in FIGS. 21 and 22, the list 211 shows that the component "ERJ3EYG10" is mounted by the mounting device "MH1". Base on this information, the data selector 143 obtains the component operation code "M1608R" from the list 221 in the facility operation data. Based on the component operation code, the data selector 143 then obtains the detailed facility operation requirement from the list 222. Based on the mounting device "MH1" as a key, the data selector 143 obtains the requirements applicable to any component from the list 223. Based on these data obtained by the data selector 143, the 3D graphics data generator 144 calculates data representing the state of the circuit board after mounting, and generates 3D graphics data for displaying the outer shape of the circuit board and the components mounted at the mounting position. At this time, the 3D graphics data is generated according to the operation order of the mounting devices as shown in the list 224 and also the mounting order as shown in the list 211. In FIGS. 21 and 22, the components are mounted in the order as "ERJ3EYG10", "ERJ3EYG20", "ECJ4EYD10", and then "TRD3GEY", and therefore the 3D graphics data is generated as such. Based on the 3D graphics data thus generated by the 3D graphics data generator 144, the check result output unit 9 displays an image.

Thus, even in the case of a multi-device line including a plurality of mounting devices, similar effects as those in the case of a single mounting device can be obtained.

Described next is the 3D graphics display achieved by the mount state displaying method of the present invention with regard to a specific example.

Figure 23:
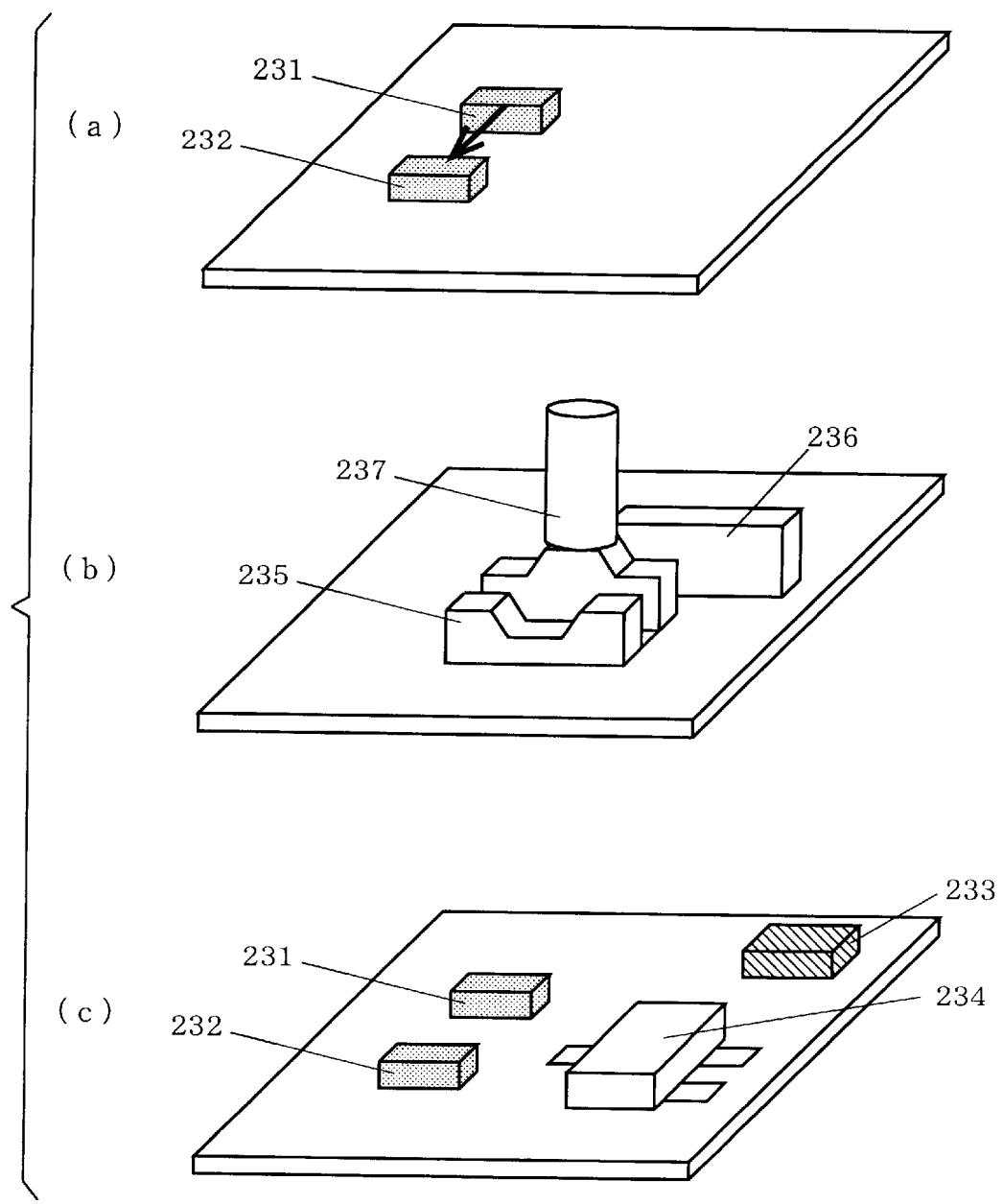
FIGS. 23 to 25 are diagrams each illustrating examples of 3D images displayed on the check result output unit 9.

In the mount state displaying method according to the present invention, the mounting order of the components can be displayed. By way of example, the mounting order is displayed with an arrow, as shown in (a) of FIG. 23, clearly indicating that a component 231 is mounted first, and then a component 232. It is easier to find any error in the mounting order with such a display as compared to having to look at the list 161. In the conventional method of manufacturing a prototype of a circuit board, the mounting order cannot be known from the prototype. Therefore, in order to check the mounting order, the mounting operation has to be monitored during the manufacturing of the prototype. The present method, on the other hand, provides a clear indication of the mounting order. Furthermore, unlike the conventional 2D display, 3D display can provide a clear distinction of the shapes of the components even when they look similar in shape and size when viewed from above.

Figure 20:
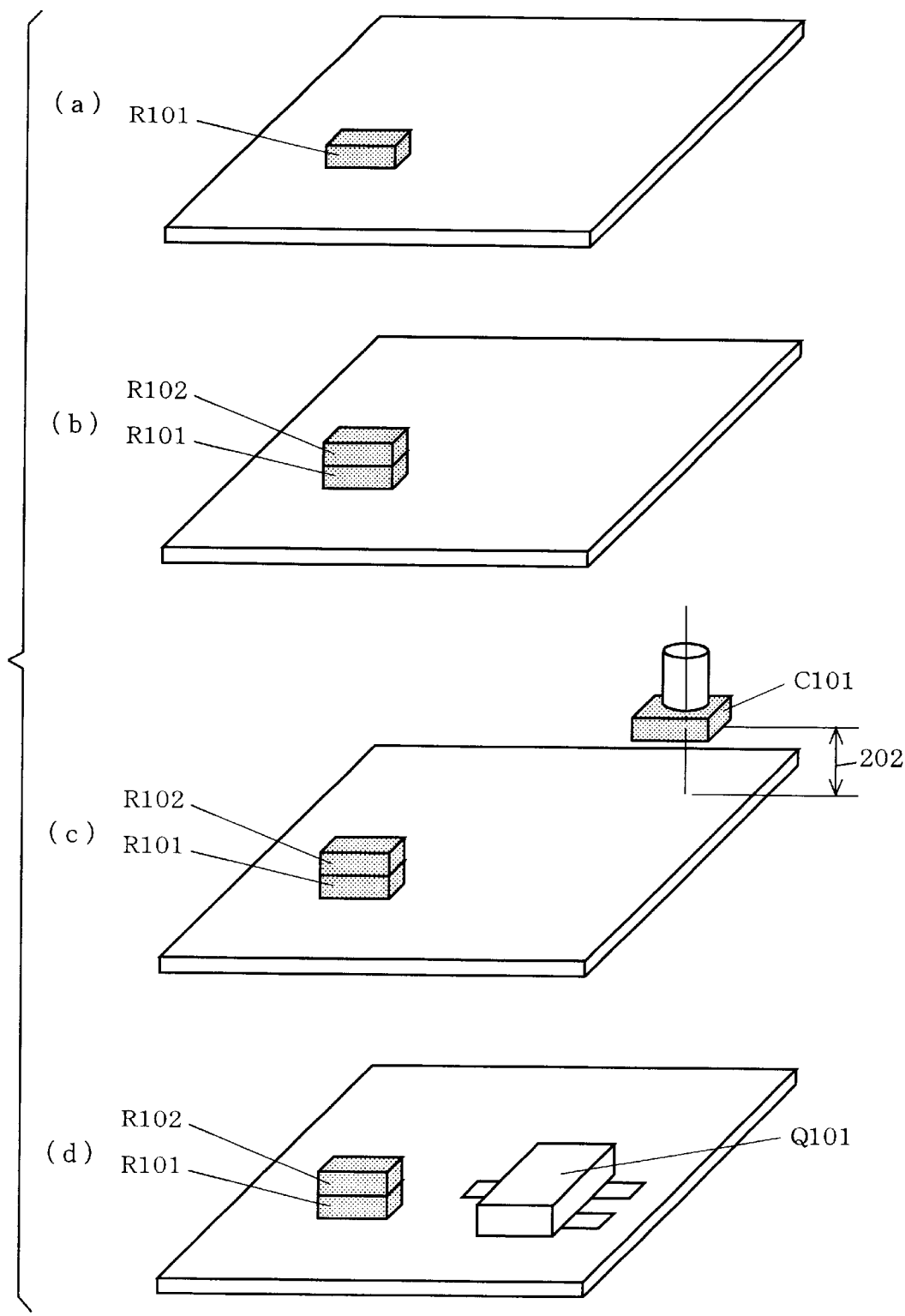
FIG. 20 is a diagram showing a 3D image displayed based on the 3D graphics data generated by the 3D graphics data generator 144.

Also, in the mount state displaying method according to the present invention, the order of mounting the components can also be provided by successively displaying the images shown in (a) to (d) of FIG. 20. Such a successive display enables the user to easily know where a problem occurs during the course of mounting. For example, in FIG. 20, a component "R102" is placed on a component "R101" as shown in (b) of FIG. 20. Therefore, the problem occurs at this moment. In the list 211, the same mounting coordinates are specified for both of the components, and therefore the mounting position is erroneous. For a component "C101", it is not mounted on the circuit board, as shown in (d) of FIG. 20. This display does not visually illustrate the reason why the component "C101" is not mounted, e.g., that a problem occurred at the time of mounting the component "C101" or that another component flicked it away. Displaying the successive screens, on the other hand, enables the user to know, as shown in (c) of FIG. 20, that the component "C101" has not successively mounted on the circuit board due to an insufficient nozzle falling amount.

If such a successive display is carried out in the multi-device line, the mount state screens are successively displayed from the screens for the first mounting device at the head of the line.

Furthermore, in the mount state displaying method according to the present invention, the state as to how the suction nozzle sucks the component can be displayed. For example, as shown in (b) of FIG. 23, it is possible to display at which position the nozzle 237 has sucked the component 235, to which position the nozzle 237 has come down, or whether the component 235 has not interfered with another component 236. For a component which is asymmetrical in shape, the nozzle may not suck at the center of the asymmetrical component because of the balance of the entire component's gravity, a lack of any portion at the center portion of the upper plane which is appropriate for suction, or for other reasons. In such a case, however, an appropriate offset has to be set between a position to be sucked and a position to be mounted, that is, the center position of the component. However, the offset is prone to be erroneously set. The display according to the present invention enables the user to visually know whether the position to be sucked is appropriate or not, or whether the offset is correct or not, for example.

Still further, in the mount state displaying method according to the present invention, how the components are assigned to apparatuses on the multi-device line are displayed. That is, as described above, when there are a plurality of mounting devices, which component is mounted on the circuit board by which mounting device is given by the list 211. Also given by the list 211 is the order of mounting the components for each mounting device. By using such information, the result of assigning the components are displayed such that the components are differently colored on the screen for each mounting device. Such a display enables the user to know that the components 231 and 232, a component 233, and a component 234 are assigned to different mounting devices.

Still further, in the mount state displaying method according to the present invention, the mount state and a mounting error can be simultaneously displayed when it is determined that the component cannot be correctly mounted. That is, as described above, the 3D graphics data generator 144 determines whether the component can be mounted at the specified position based on the circuit board data and the facility operation data. Therefore, if it is determined that the component cannot be mounted at the specified position, 3D graphics data representing values and requirements corresponding to the determination is generated for display.

Figure 24:
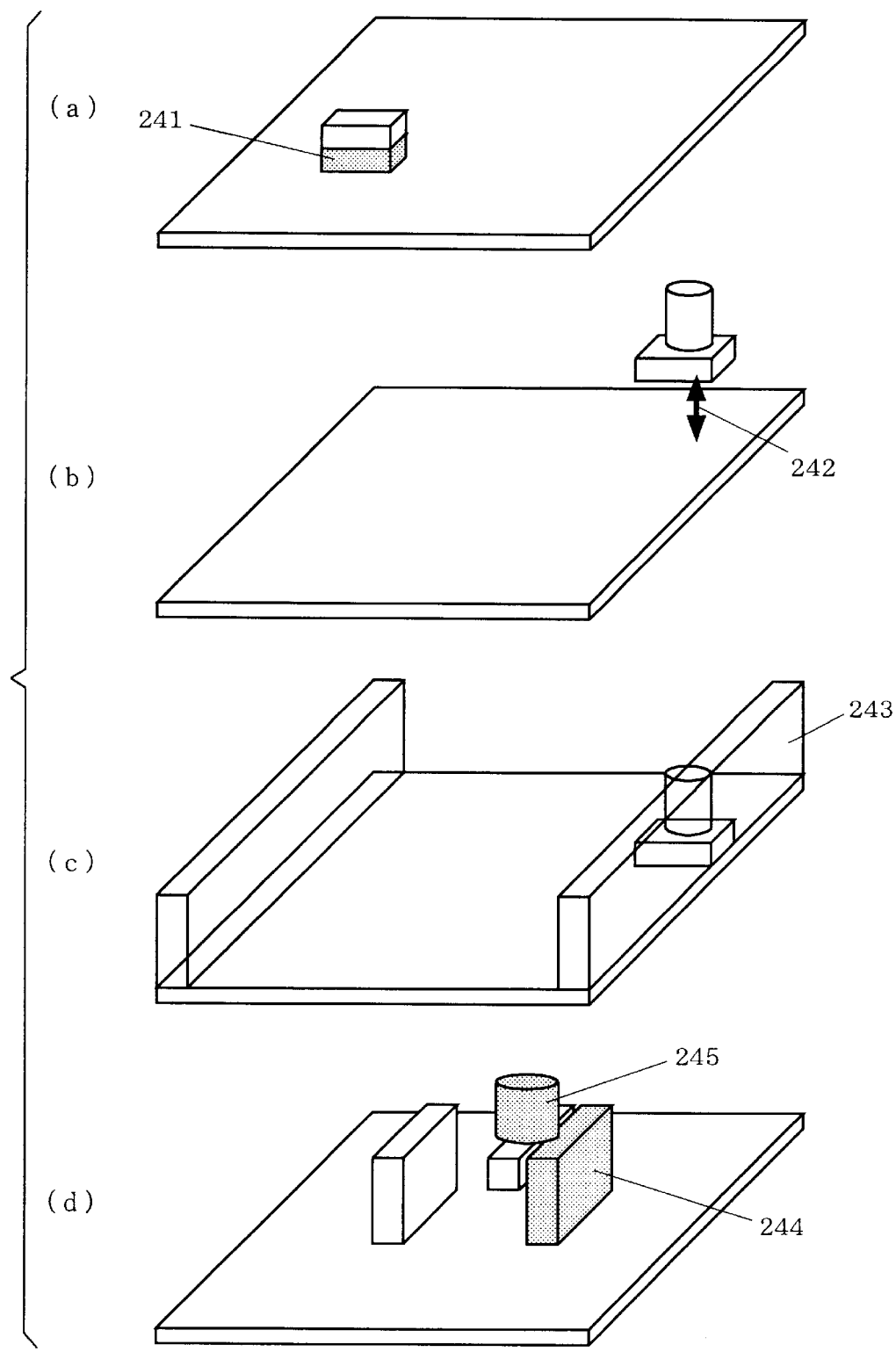

For example, in step S1903 of FIG. 19, whether the target component is mountable at the coordinates specified by the circuit board data is determined based on a nozzle selection, a gap between the nozzle falling position and the upper surface of the board, any possible interfering object in the vicinity of the specified position, a facility operable range, and other factors. At this time, if it is determined that the target component is not mountable at the specified position, a predetermined graphic representing an error is generated for 3D display. In the example of FIGS. 16 and 17, the circuit board data "BRD0011" contains the same mounting position in XY coordinates as the components "R102" and "R101". Therefore, these components cannot be directly mounted on the board plane. In this case, as shown in (a) of FIG. 24, the interfering component "R101" is displayed as colored differently (a graphic 241). For the component "C101", if it is determined that it is not mountable due to an insufficient nozzle falling, a supplemental graphic 242 representing the gap is generated, as shown in (b) of FIG. 24. Further, if the specified mounting position is out of the mountable range, a graphic 243 representing the mountable range requirement is displayed, as shown in (c) of FIG. 24. Still further, if a component 244 and the nozzle 245 interfere with each other at a certain position, a state of such interference is displayed as shown in (d) of FIG. 24. In the conventional 2D plane graphics representation, the nozzle and the component are not easily distinguishable and how they interfere with each other is difficult to understand. In the 3D graphics representation, however, they are easily distinguishable.

As such, the cause of erroneous mounting can be quickly known, thereby allowing the designer to appropriately correct the erroneous mounting, and reducing time required for correction and check.

Figure 25:
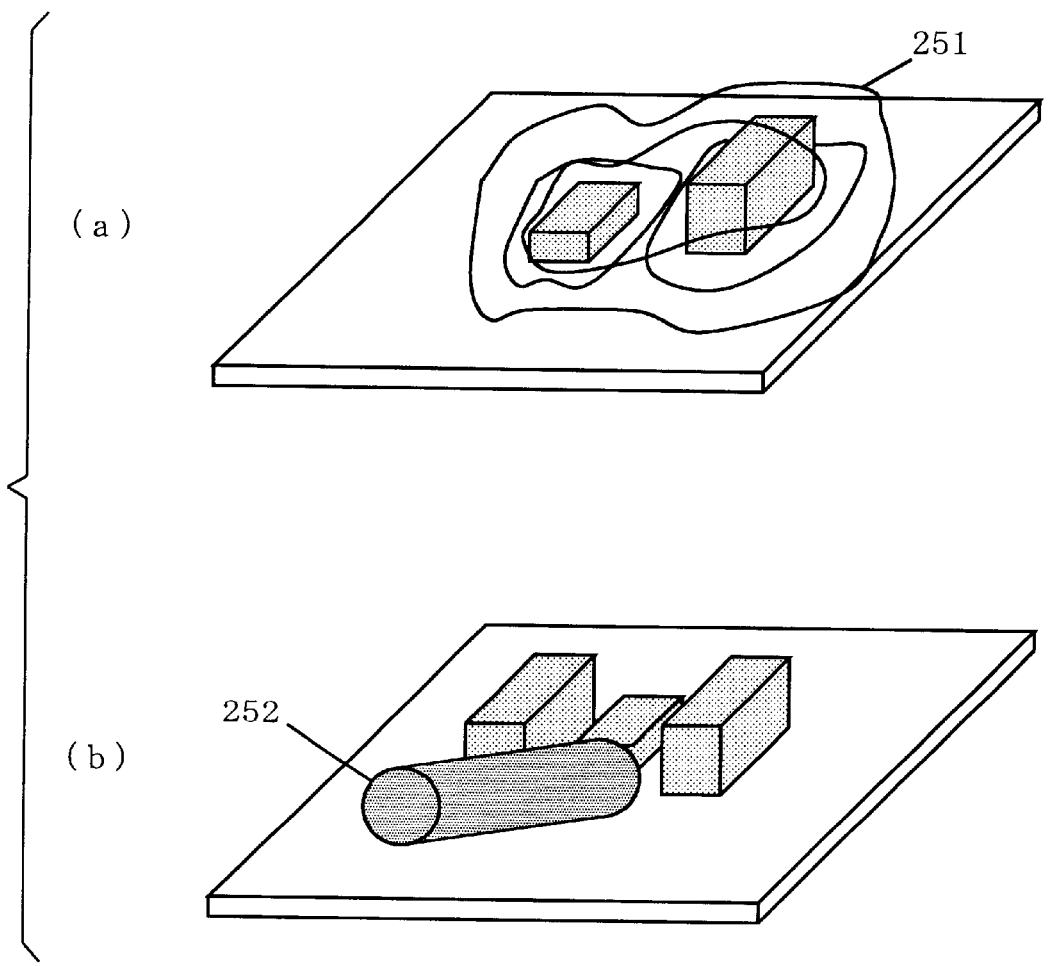

Furthermore, in the mount state displaying method according to the present invention, the various states of the mounting components can be displayed. For example, as shown in (a) of FIG. 25, isotherms 251 at the time of soldering are displayed over the components for determining the degree of thermal shock of each component. Also, as shown in (b) of FIG. 25, a soldering iron 252 is displayed with the components for determining how the shape of the soldering iron affects the components.

As described above, in the method and apparatus for displaying the mount state on the circuit board according to the second embodiment of the present invention, the mount state on the circuit board is displayed in 3D on a display screen of a computer device, for example. Thus, any component which is not distinguishable in 2D display can be sufficiently distinguishable. Also, whether the height requirement is satisfied or not can be checked. Therefore, the mount data can be virtually and reliably checked and studied without using a prototype of the circuit board, thereby designing the circuit board within a shorter period of time and at a lower cost.

(Third Embodiment)

In the above second embodiment, described is the method and apparatus for displaying the mount state on the circuit board. In a third embodiment, described are a method and apparatus for appropriately changing the circuit board data and the facility operation data based on the display result.

Figure 26:
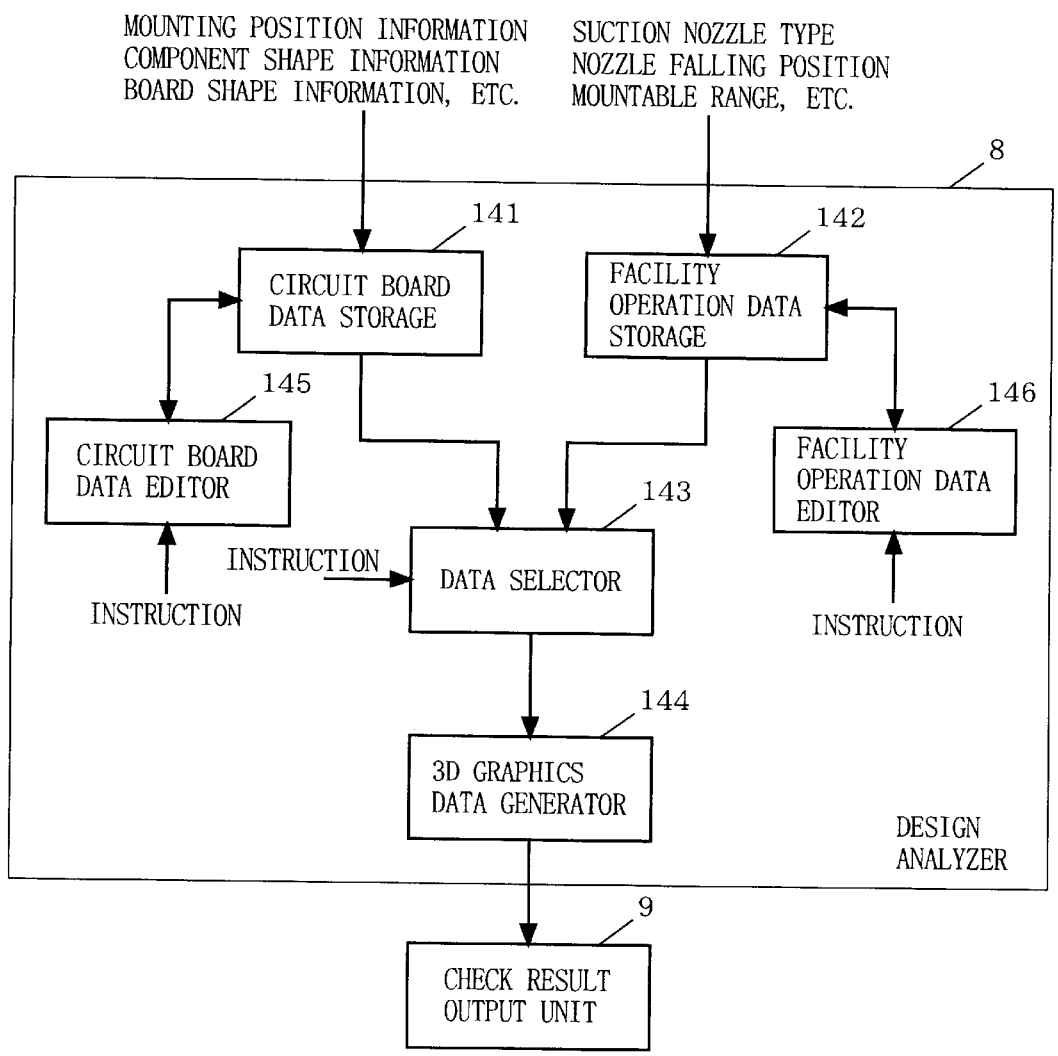
FIG. 26 is a block diagram showing the structure of an apparatus using a method of displaying the mount state on a circuit board according to a third embodiment of the present invention.

FIG. 26 is a block diagram showing the structure of an apparatus using the method of displaying the mount state on the circuit board according to the third embodiment of the present invention. In FIG. 26, the apparatus according to the third embodiment includes a circuit board data storage 141, a facility operation data storage 142, a data selector 143, a 3D graphics data generator 144, a circuit board data editor 145, and a facility operation data editor 146.

As shown in FIG. 26, the display apparatus according to the third embodiment has the structure of the display apparatus according to the above-described second embodiment but with the circuit board data editor 145 and the facility operation data editor 146 added thereto. Described below is the display apparatus according to the third embodiment, focusing on these added editors.

The circuit board data editor 145 reads the circuit board data stored in the circuit board data storage 141 for editing, and writes the edited results into the circuit board data storage 141 so as to be stored therein. Similarly, the facility operation data editor 146 reads the facility operation data stored in the facility operation data storage 142 for editing, and writes the edited result into the facility data storage 142 so as to be stored therein.

Figure 27:
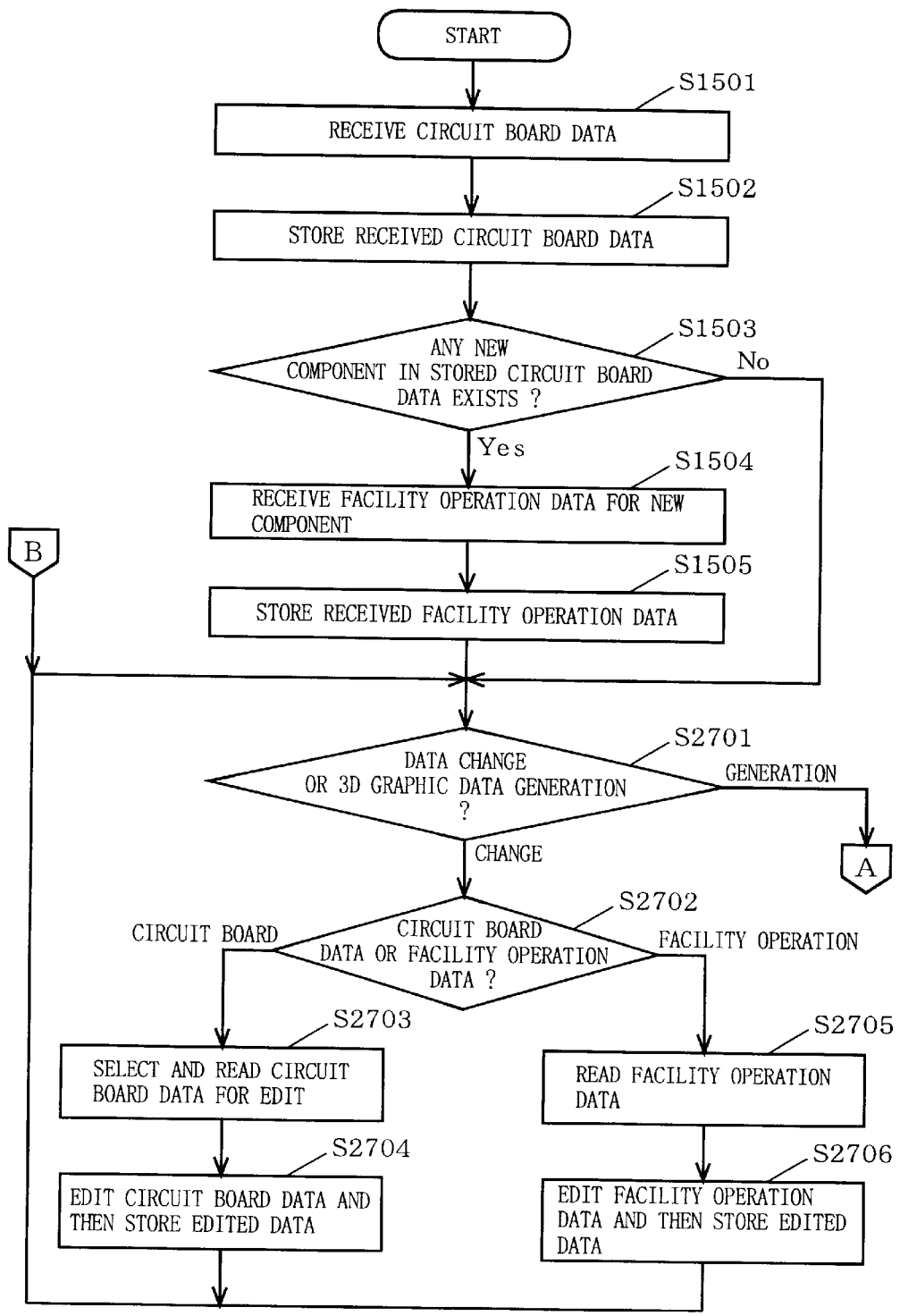
FIGS. 27 and 28 are flowcharts showing the procedure of the method of displaying the mount state on the circuit board according to the third embodiment of the present invention.
Figure 28:
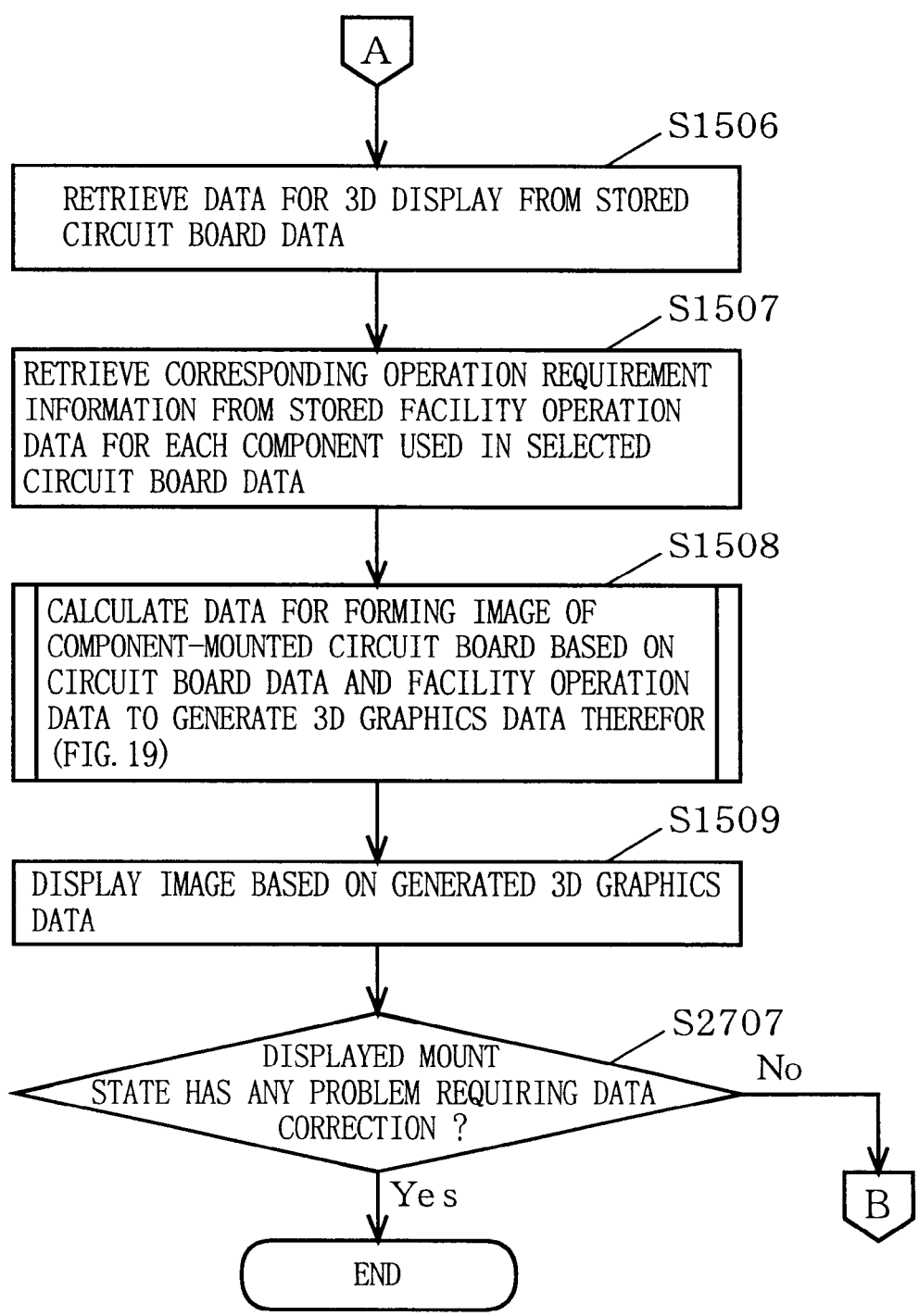

FIGS. 27 and 28 are flowcharts showing the procedure of the method of displaying the mount state on the circuit board according to the third embodiment of the present invention. In FIGS. 27 and 28, each step similar to that in FIG. 15 is provided with the same step number, and not described herein.

Once the circuit board data is stored in the circuit board data storage 141 and the facility operation data is stored in the facility operation data storage 142 (steps S1501 to S1505), either data change or 3D graphics data generation is selected (step S2701).

When data change is selected, either the circuit board data or the facility operation data is selected to be changed (step S2702). If the circuit board data is selected to be changed, the circuit board data editor 145 reads the circuit board data to be changed from the circuit board data storage 141 (step S2703). The circuit board data editor 145 then edits the data by following an instruction from the user and stores the edited data in the circuit board data storage 141 (step S2704). On the other hand, if the facility operation data is selected to be changed, the facility operation data editor 146 reads the entire facility operation data stored in the facility operation data storage 142 (step S2705), since the facility operation data is not dependent on the type of circuit board. The facility operation data editor 146 then edits the data by following an instruction from the user and stores the edited data in the facility operation data storage 142 (step S2706). After the editing process ends in step S2704 or S2706, the procedure returns to step S2701 for selecting either data change or 3D graphics data generation.

If 3D graphics data generation is selected, 3D graphics data is generated for the circuit board to be displayed in 3D, and an image based on the 3D graphics data is displayed on the check result output unit 9 (steps S1506 to S1509), which has been described above in the second embodiment.

The displayed image is then checked to see if there is any problem requiring data correction. If no problem has been found, the procedure ends. If any problem has been found, the procedure returns to step S2701 for selecting data change (step S2707).

As described above, the method and apparatus for displaying the mount state on the circuit board according to the third embodiment of the present invention enables the data to be edited and the mount state to be displayed after the data is edited for checking the mount state. Thus, even if any problem has been found on the 3D display screen, the apparatus does not have to receive new data, thereby saving time for check and correction.

(Fourth Embodiment)

In the above third embodiment, described is the method and apparatus for changing the circuit board data and the facility operation data as required based on the display result. In a fourth embodiment, described is a method for displaying a difference between before and after changes to better facilitate the check on the display after data change.

Figure 29:
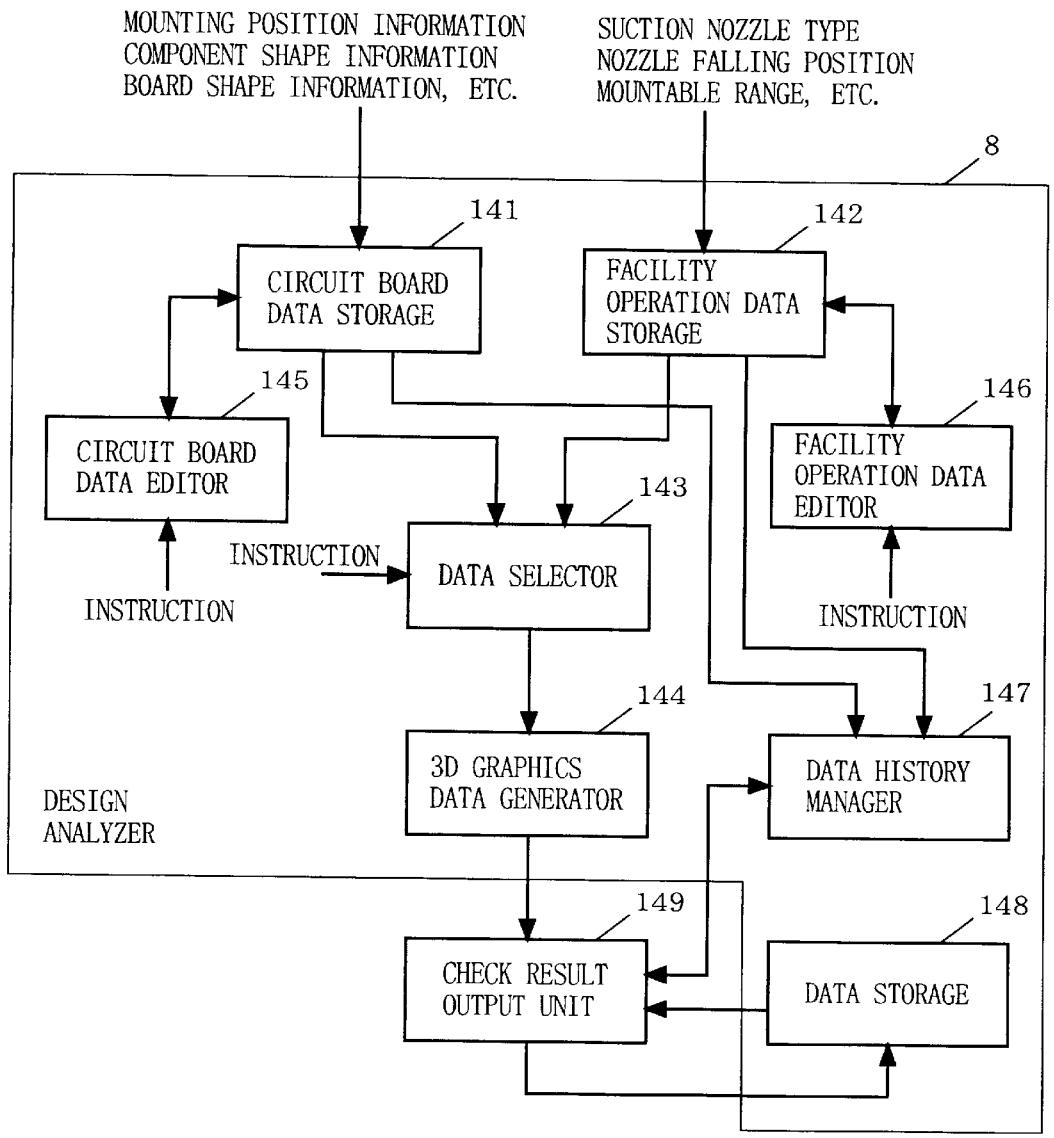
FIG. 29 is a block diagram showing the structure of an apparatus using a method of displaying the mount state on a circuit board according to a fourth embodiment of the present invention.

FIG. 29 is a block diagram showing the structure of an apparatus using the method for displaying the mount state on the circuit board according to the fourth embodiment of the present invention. In FIG. 29, the mount state display apparatus according to the fourth embodiment includes a circuit board data storage 141, a facility operation data storage 142, a data selector 143, a 3D graphics data generator 144, a circuit board data editor 145, a facility operation data editor 146, a data history manager 147, and a data storage 148.

As illustrated in FIG. 29, the mount state display apparatus according to the fourth embodiment has the structure of the mount state display apparatus according to the third embodiment but with the data history manager 147 and the data storage 148 added thereto. Also, a check result output unit 149 is equivalent to the check result output unit 9 with a new function added thereto. Described below is the structure of the mount state display apparatus according to the fourth embodiment, focusing on these different constituents.

The data history manager 147 stores a circuit board data name and its storage time for each circuit board data stored in the circuit board data storage 141. Similarly, the data history manager 147 stores a storage time of the facility operation data stored in the facility operation data storage 142. Note that the facility operation data is common to any circuit board, and therefore there is only a single piece of information.

For displaying an image, the check result output unit 149 first refers to the data history manager 147 by using the name of the circuit board data corresponding to the circuit board data for which the current 3D graphics data has been generated by the 3D graphics data generator 144. If it is determined that any 3D graphics data has been previously generated based on the circuit board data and then the circuit board data or the facility data has been edited, the check result output unit 149 reads the previous 3D graphics data from the data storage 148 and simultaneously displays an image based on both the current and previous 3D graphics data.

The 3D graphics data is stored in the data storage 148 in relation to the circuit board data name after it is displayed on the check result output unit 149.

Figure 30:
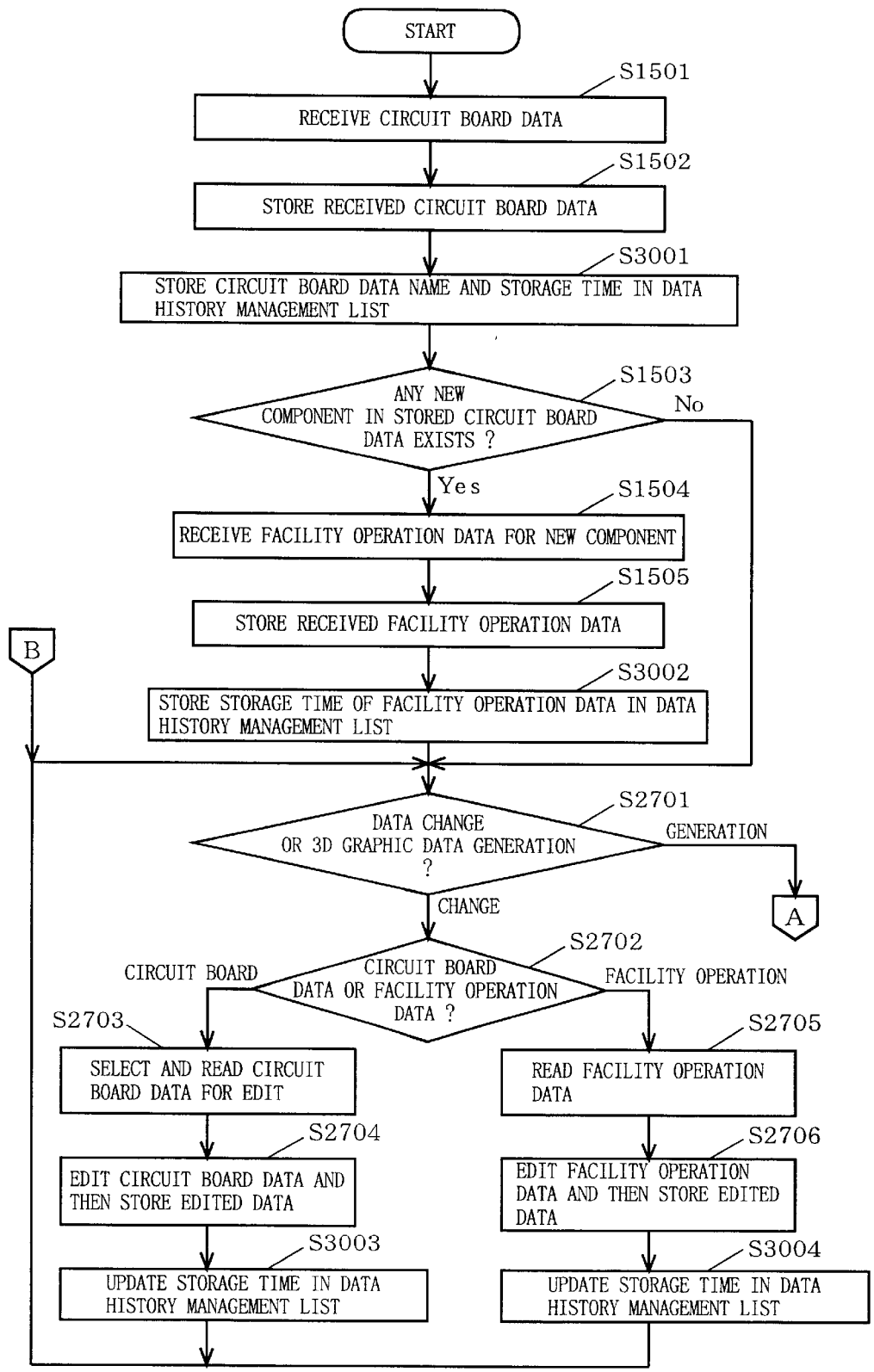
FIGS. 30 and 31 are flowcharts showing the procedure of the method of displaying the mount state on the circuit board according to the fourth embodiment of the present invention.
Figure 31:
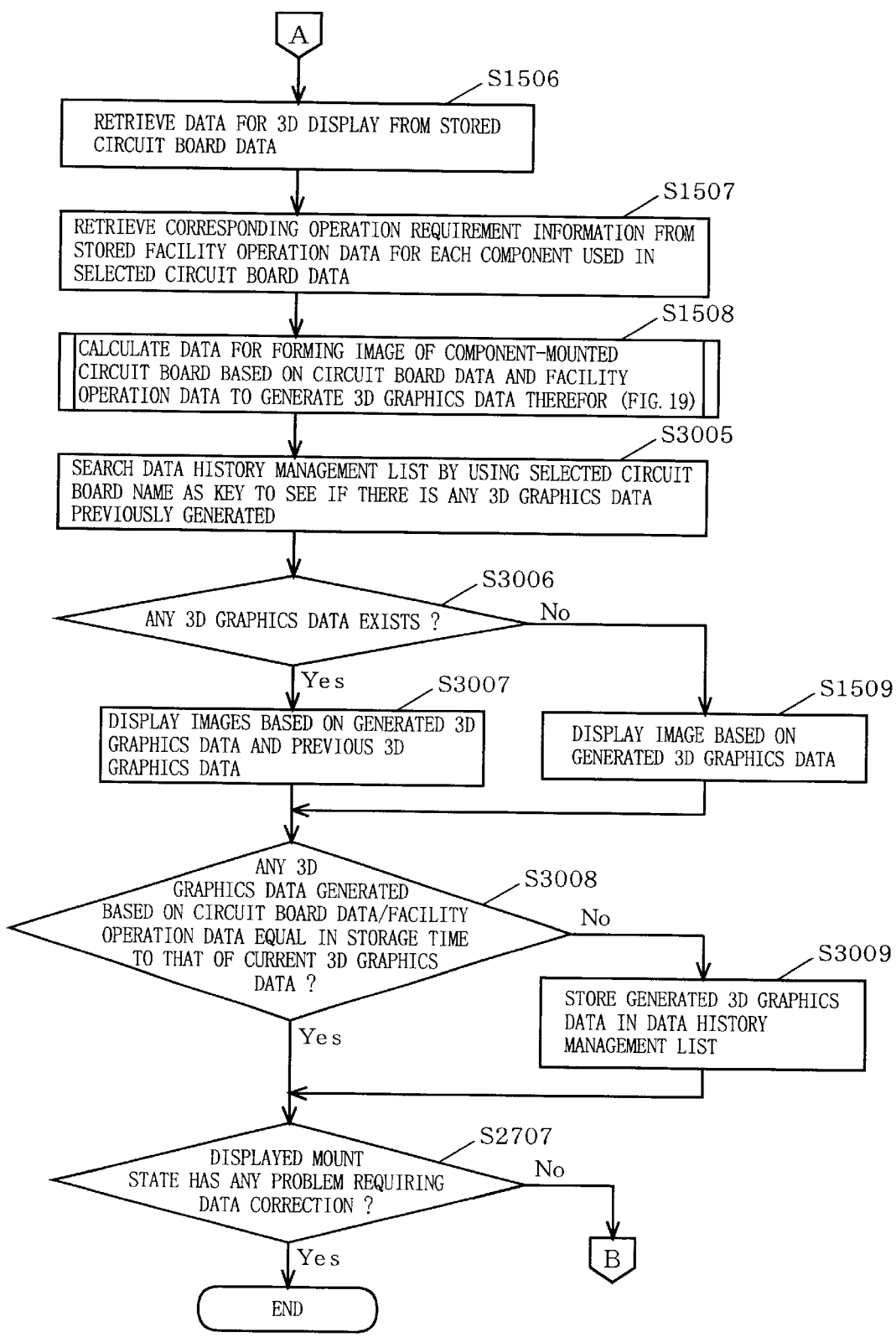

FIGS. 30 and 31 are flowcharts showing the procedure for displaying the mount state on the circuit board according to the fourth embodiment of the present invention. Note that each step in FIGS. 30 and 31 which is similar to that in FIGS. 15, 27, and 28 is provided with the same step number and is not described herein.

Once the supplied circuit board data is stored in the circuit board data storage 141, the name and the storage time of the circuit board data are stored in the data history manager 147 (step S3001). If the facility operation data is supplied and stored in the facility operation data storage 142, the storage time of the facility operation data is stored in the data history manager 147 (step S3002).

FIG. 32 is a diagram showing one example of data history management information managed by the data history manager 147. In FIG. 32, the data history management information includes a list 321 for managing circuit board data storage time, a list 322 for managing facility operation data storage time, and a list 323 for managing 3D graphics data. The storage time of the circuit board data is registered in the list 321, and the storage time of the facility operation data is registered in the list 322. At first, as shown in (a) of FIG. 32, no 3D graphics data is generated, and therefore no information related to the circuit board data is registered in the list 323.

After the data management information is stored in the data history manager 147, data change or 3D graphics data generation is selected (step S2701). First described is a case where 3D graphics data generation is selected. In this case, as described above, 3D graphics data is generated for the circuit board to be displayed in 3D (target circuit board) and given to the check result output unit 149 (steps S1506 to S1508). Here, the check result output unit 149 searches the data history management information and retrieves the previous 3D graphics data for the target circuit board from the list 323 if any such previous 3D graphics data can be found (step S3005). In the example shown in (a) of FIG. 32, no previous data can be found. Therefore, the check result output unit 149 displays an image based only on the current 3D graphics data (steps S3006, S1509).

The check result output unit 149 then searches the list 323 again for any generated 3D graphics data based on the circuit board data and/or facility operation data which are equal in storage time to that of the current 3D graphics data (step S3008). In this example, the current 3D graphics data is the first one generated. Therefore, a set of the current 3D graphics data and the storage times of the circuit board data and the facility operation data are registered in the list 323 and automatically provided with a unique 3D graphics data name. In the data storage 148, the 3D graphics data is stored with the provided 3D graphics name as a key.

Described next is a case where data change is selected in step S2701. When the circuit board data is selected to be changed, the circuit board data is edited and then stored in the circuit board data storage 141. Then, the storage time stored in the list 321 in step S3001 is updated (step S3003). When the facility operation data is selected to be changed, on the other hand, the facility operation data is edited and then stored in the facility operation data storage 142. Then, the storage time stored in the list 322 is updated (step S3004).

For example, as illustrated in (d) of FIG. 20, the mounting positions of the components "R101" and "R102" coincide with each other based on the data shown in FIG. 16. Therefore, the mounting position information of the circuit board data is changed as shown in FIG. 33. The storage time in the list 321 is updated, as shown in (b) of FIG. 32, to the time when the change result is stored in the circuit board data storage 141. In the example of FIG. 16, the facility operation data is not changed, and therefore the list 322 is not changed.

Based on the change result, new 3D graphics data is generated. At the time of screen display, the list 323 of the data history manager 147 contains the previous 3D graphics data "BRD0011-1" before data change ((b) of FIG. 32). Therefore, the check result output unit 149 simultaneously displays images based on the new 3D graphics data after the change result and the stored previous 3D graphics data "BRD0011-1" (steps S3006, S3007).

Figure 35:
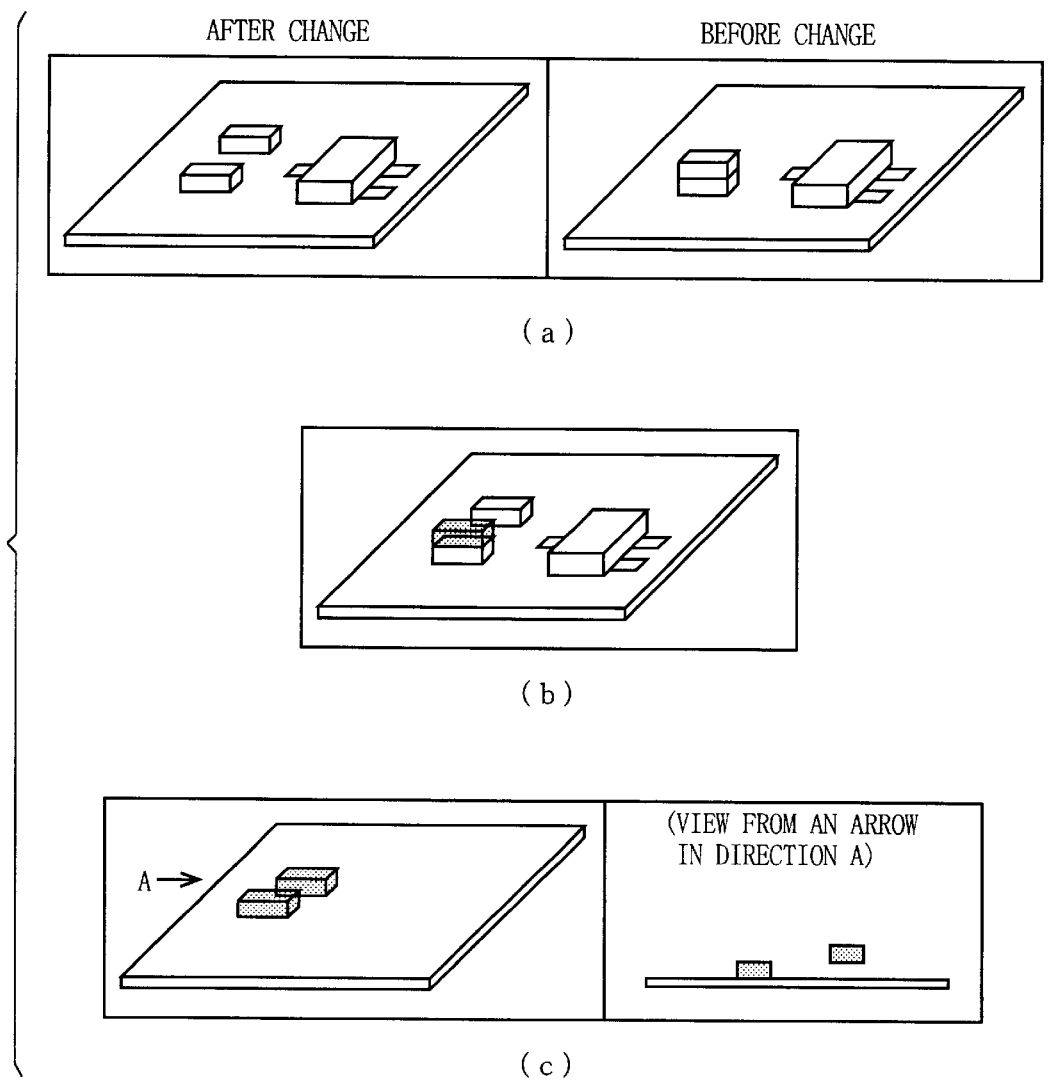
FIG. 35 is a diagram showing one example of a 3D image displayed on a check result output unit 149.

FIG. 35 shows examples of graphic images displayed for indicating a difference between before and after changes. As shown in (a) of FIG. 35, two images may be simultaneously displayed; as shown in (b) of FIG. 35, a component before a change may be displayed as colored differently from the component after a change; and as shown on the left half of (c) of FIG. 35, on comparison between the previous and changed 3D graphics data, only the components different from those before a change may be displayed (on the right half of (c), a viewpoint is changed by rotation). Such display examples enable the user to easily check the data change and its influence on the mount state.

The check result output unit 149 then searches the list 323 again for any generated 3D graphics data based on the circuit board data and/or facility operation data which are equal in storage time to that of the current 3D graphics data (step S3008). At this time, the changed 3D graphics data is different from the previous one in the storage time of the circuit board data. Therefore, the changed 3 D graphics data including the storage times of the circuit board data and the facility operation data is also registered in the list 323 (FIG. 34). With such a process, the 3D graphics data can be stored in the data storage 148 as data representing the difference only when the circuit board data or the facility operation data is changed.

As to a deletion of the 3D graphics data stored in the data storage 148, such a deletion may be carried out at the same time when the corresponding circuit board data contained in the list 321 is deleted. Alternatively, a certain number of generations to be stored may be predetermined, and when reaching the predetermined generation, the 3 D graphics data may be deleted in the order of their generation with the oldest generation being deleted first.

As described above, in the method and apparatus for displaying the mount state on the circuit board according to the fourth embodiment of the present invention, data history is used for displaying a difference between the current data and the previous data. Such a display enables the user to more easily check the influence on the mount state by the data change.

The method of displaying the mount state on the circuit board described in the second to fourth embodiments can be applied to a case where an actual circuit board having components mounted thereon is inspected by a board inspection process and the state of inspection is displayed. Described below is one example of the procedure for displaying the state of inspection.

In this case, the circuit board data storage 141 is supplied with the data described above and is also supplied with inspection position data for each component and other data for storage. The facility operation data storage 142 is supplied with the data described above and is also supplied with inspective operation requirement information such as an inspectable range related to an inspection facility to be stored. The data selector 143 retrieves the circuit board and the data related to inspection items for 3D display from the circuit board data storage 141 and the facility operation data storage 142. Based on the respective data retrieved by the data selector 143, the 3D graphics data generator 144 calculates data representing the mount state on the circuit board to generate 3D graphics data for displaying the outer shape of the circuit board and each component mounted thereon at a respective mounting position. The 3D graphics data generator 144 also generates another 3D graphics data based on which of the operations corresponding to the respective inspection items can be represented. For example, based on such 3D graphics data, the state of a component assignment and the order of inspection can be represented by color or by a supplemental line, or a laser inspection is represented with a laser axis. The check result output unit 9 or 149 displays an image based on the mount-related 3D graphics data and the inspection-related 3D graphics data generated by the 3D graphics data generator 144.

Figure 36:
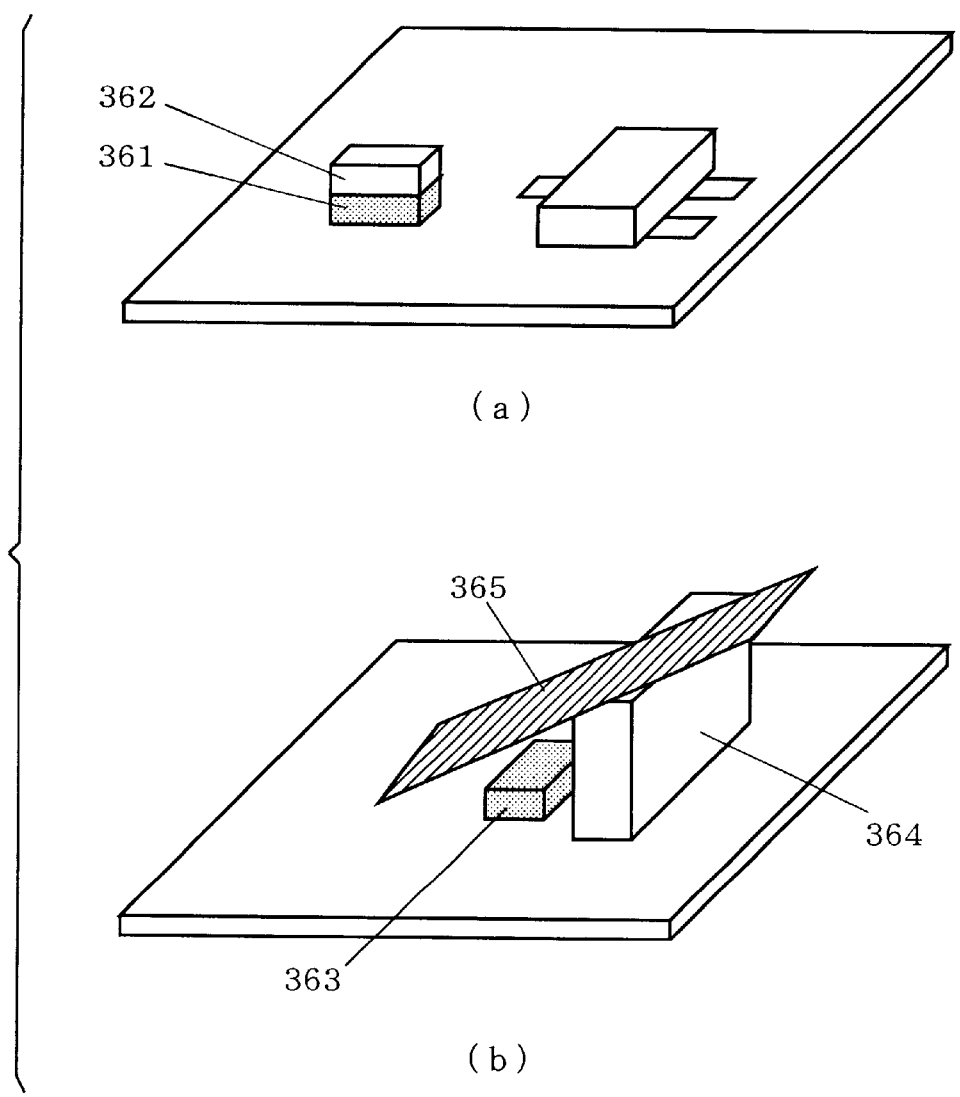
FIG. 36 is a diagram showing one example of a 3D image displayed on the check result output unit 149 when the present invention is applied for displaying the state of inspection on the circuit board.
Figure 37:
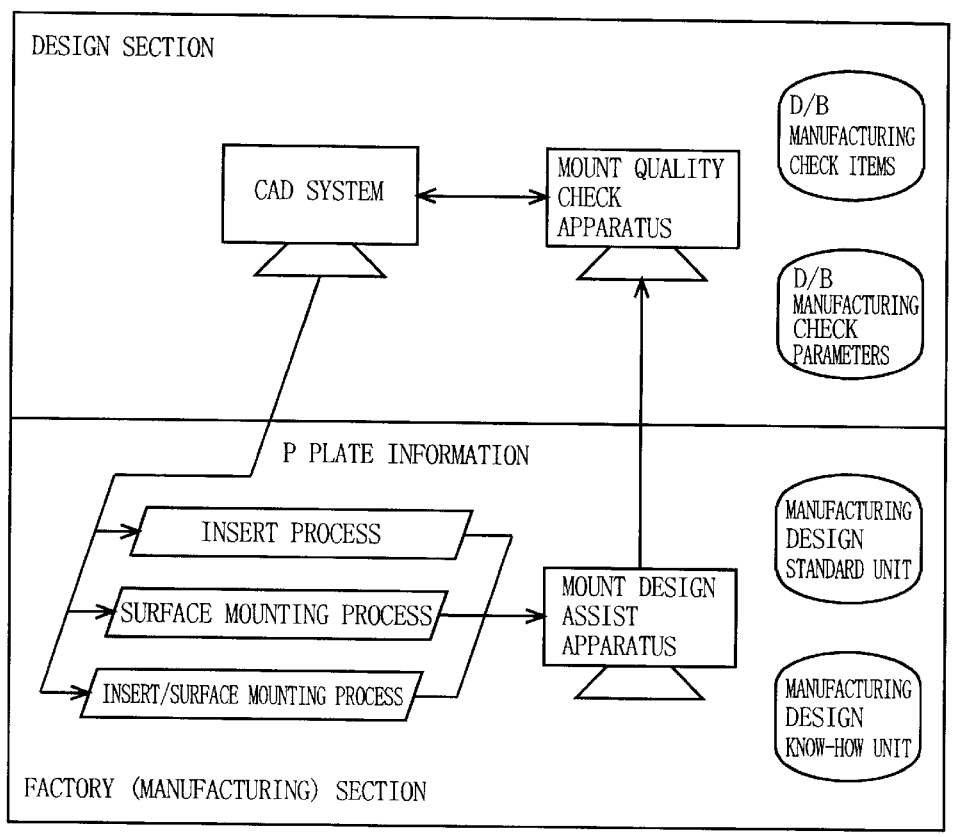
FIG. 37 is a diagram demonstrating the concept of a conventional method of checking the mount quality of a circuit board.
Figure 38:
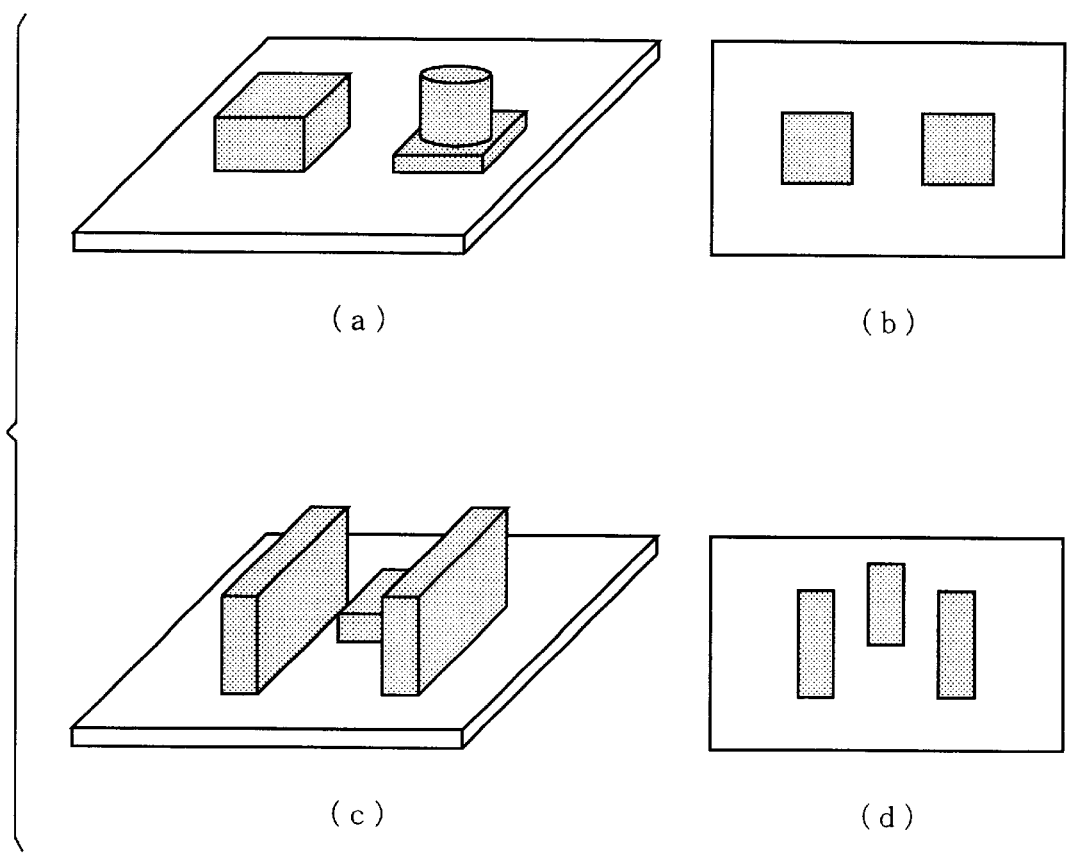
FIG. 38 is a diagram showing one example of a conventional method of displaying the mount state on a circuit board.

One example of the state of inspection displayed on the check result output unit 9 or 149 is shown in FIG. 36. Shown in (a) of FIG. 36 is a diagram showing the mount state on the circuit board to be inspected from the top by a camera for an image check. As shown in (a) of FIG. 36, a component 362 is placed on a component 361 on the circuit board due to an error in the circuit board data. In such a circuit board, the component 361 cannot be inspected, and therefore, the component 361 is displayed in a different color, for example. Shown in (b) of FIG. 36 is a diagram showing the mount state on the circuit board to be inspected by a laser light for a mount position check. As shown in (b) of FIG. 36, an irradiation plane 365 of the laser light is displayed, thereby enabling the user to easily recognize that the component 363 cannot be inspected due to a taller component 364.

As such, in addition to the mount state on the circuit board, the inspection state is also displayed. Thus, it is possible to virtually and reliably check the inspection data without using any prototype of the circuit board. Also, the circuit board can be designed within a short period of time and at a low cost.

The method of checking the mount quality and the method of displaying the mount state according to the present invention can be applicable to printed board circuits, flexible resin board circuits, and circuits printed or etched on boxes, for example.

Typically, the method of checking the mount quality and the method of displaying the mount state according to the above embodiments are realized by executing a predetermined program on a computer device. The apparatus using any of the above methods is realized by a storage (ROM, RAM, hard disk unit, or the like) having a predetermined program stored therein and a CPU (Central Processing Unit) for executing the program. In this case, the predetermined program may be provided through a recording medium, such as a CD-ROM or a floppy disk, which is readable by a computer device.

While the invention has been described in detail, the foregoing description is in all aspects illustrative and not restrictive. It is understood that numerous other modifications and variations can be devised without departing from the scope of the invention.

What is claimed is:

1. A method of checking a mount quality of a circuit board having components mounted thereon by a mounting device, said method comprising:

receiving board information corresponding to the circuit board to be used in a designed circuit, component information corresponding to the components to be used, and position information corresponding to a mounting position of the components;

receiving a mount requirement specifying a mounting process and a mounting device to be used in manufacturing the circuit board; and checking, based on a requirement for said mounting process and a requirement for operation of the mounting device, to see whether the circuit board manufactured from said board information, said component information, and said position information under said mount requirement can satisfy a predetermined target mount quality.

2. The method according to claim 1, further comprising checking, based on said requirement for said mounting process and said requirement for operation of the mounting device, to see whether the circuit board manufactured from said board information, said component information, and said position information under said mount requirement can satisfy a predetermined target productivity.

3. The method according to claim 1, wherein said component information includes at least a number, a shape, a packaging, and a size of each of the components.

4. The method according to claim 1, wherein said board information includes at least a material, a shape and a thickness of the circuit board, and a land shape, a printed mask shape and a position correction mark shape of each of the components.

5. The method according to claim 1, wherein said requirement for said mounting process includes at least soldering processes, a soldering material to be used, and a board inspection process carried out after the components are mounted.

6. The method according to claim 1, wherein said requirement for operation of the mounting device includes at least a component type, a mount accuracy for each of the components, a mount cycle time, and a range of the circuit board in which the components are mountable.

7. The method according to claim 1, wherein said mount quality is checked as to at least the mounting position of the component, a state of soldering, a board inspection process carried out after the components are mounted, and a state of an outer shape of the circuit board.

8. The method according to claim 1, further comprising retrieving said component information and said requirement for operation of the mounting device from a CAM system that generates operation data of the mounting device.

9. The method according to claim 1, further comprising changing said requirement for said mounting process and said requirement for operation of the mounting device based on a quality of performance of an actually manufactured circuit board.

10. The method according to claim 1, wherein, in said checking to see whether the circuit board can satisfy a predetermined target mount quality, if the circuit board does not satisfy a predetermined mount quality, the circuit board is changed and the mount quality is then rechecked only in a range corresponding to a portion changed or at a portion at which an error occurred.

11. The method according to claim 1, wherein said mount requirement includes at least one of soldering processes, a soldering material, and a board process as a mounting process requirement, and said mount requirement includes at least one of a factory name and a mounting device name as a mounting device requirement.

12. A method of virtually displaying a mount state of electronic components mounted on a circuit board by one or more mounting devices based on data used by the mounting devices, said method comprising:
receiving, as the data used by the mounting devices, circuit board data including information corresponding to mounting positions and shapes of components mounted on the circuit board, and information corresponding to a shape of the circuit board;
receiving, for each of the mounting devices, facility operation data including information corresponding to operation requirements of each of the mounting devices;
storing said circuit board data and said facility operation data;
selecting a circuit board from said stored circuit board data to be displayed in 3D;
generating 3D graphics data for displaying outer shapes of the circuit board and the components at respective mounting positions by retrieving, from said stored facility operation data, data required for said circuit board data of the selected circuit board, and calculating data representing a state of the circuit board having the components mounted thereon; and
displaying an image based on said generated 3D graphics data.

13. The method according to claim 12, wherein said facility operation data including information corresponding to operation requirements of each of the mounting devices comprises a type and placement position of a suction nozzle to be used, an allowable distance between the components, and an operational area of the suction nozzle.

14. The method according to claim 12, wherein in said generating 3D graphics data, said 3D graphics data is generated for displaying, in 3D, positions of the components after the components are mounted, a component assignment to each mounting device, an order of mounting the components, and a state of any component being sucked by a suction nozzle.

15. The method according to claim 12, wherein in said displaying an image, a mounting operation is displayed by successively displaying moving images according to an order of mounting the components.

16. The method according to claim 12, further comprising changing said stored circuit board data or said stored facility operation data with regard to component information, mounting position information and a type or a placement position information of a suction nozzle, and storing changed data.

17. The method according to claim 16, wherein
in said changing said stored circuit data or said stored facility operation data, a storage time of said changed data is stored as a history,
in said displaying an image, when an image is displayed based on 3D graphics data newly generated after the data is changed, said 3D graphics data generated before the data is changed is searched for in said stored history, and the image is displayed based on said 3D graphics data generated after the data is changed and said 3D graphics data generated before the data is changed to show a difference in the mount state after the data is changed, and
said method further includes storing, as the history, 3D graphics data corresponding to changes in said storage time.

18. The method according to claim 12, wherein
in said generating 3D graphics data, when the component cannot be mounted at the mounting position as specified in said circuit board data, an error-state 3D graphics data is generated for representing a defective part or the cause thereof, and
in said displaying an image, the image is displayed based on said 3D graphics data and said error-state 3D graphics data.

19. The method according to claim 12, further comprising:

receiving operation requirements for one or more inspecting devices for inspecting a mount state of the electronic components; and generating 3D graphics data for displaying in 3D a component assignment to each inspecting device, an order of inspecting the components, and a possible facility operation interference range by using the information corresponding to the mounting positions included in said circuit board data as inspection position information.

20. An apparatus for checking a mount quality of a circuit board having components mounted thereon by a mounting device, said apparatus comprising:

a data input unit for receiving board data corresponding to a circuit board to be used for a designed circuit, component data corresponding to components to be used, and position information corresponding to respective mounting positions of the components;

a circuit board information storage having information corresponding to available circuit boards previously stored therein, said circuit board information storage being operable to output board information corresponding to said board data;

a component information storage having information corresponding to available components stored therein, said component information storage being operable to output component information corresponding to said component data;

a mounting process requirement storage having requirements for respective available mounting processes stored therein;

a mounting device requirement storage having requirements for operations of respective available mounting devices stored therein;

an applied mount requirement input unit for inputting mount requirements specifying a mounting process and a mounting device to be used in manufacturing the circuit board; and a design analyzer for checking, based on said requirements for said mounting process and the mounting device, whether a target mount quality and a target productivity can be satisfied by the circuit board manufactured based on said board information, said component information, and said position information under said mount requirements.

21. The apparatus according to claim 20, wherein each of said requirements for said mounting process and the mounting device is changed based on a performance of a mount quality when the circuit board is actually manufactured.

22. The apparatus according to claim 20, wherein, after said design analyzer checks the circuit board, said design analyzer is further for rechecking only a predetermined area corresponding to a changed part or a part in which an error occurred when the circuit board does not satisfy a predetermined mount quality.

23. The apparatus according to claim 20, wherein said design analyzer includes:

a circuit board data storage for receiving and storing circuit board data used in the mounting device, said circuit board data including information corresponding to mounting positions and shapes of the components mounted on the circuit board and a shape of the circuit board;

a facility operation data storage for receiving and storing facility operation data related to the mounting device, said facility operation data including information corresponding to a type and placement position of a suction nozzle to be used, an allowable distance between the components, and an allowable operational range of the suction nozzle;

a data selector for selecting a circuit board from said stored circuit board data to be displayed in 3D;

a data generator for generating 3D graphics data for displaying outer shapes of the circuit board and the components at respective mounting positions by retrieving, from said stored facility operation data, data required for said circuit board data of the selected circuit board and calculating data representing a state of the circuit board having the components mounted thereon; and a data display unit for displaying an image based on said generated 3D graphics data.

24. The apparatus according to claim 23, wherein said data generator generates said 3D graphics data for displaying positions of the components after the components are mounted, a component assignment to each mounting device, an order of mounting the components, and a state of any component being sucked by a suction nozzle.

25. The apparatus according to claim 23, wherein said display unit displays a mounting operation by successively displaying moving images according to an order of mounting the components.

26. The apparatus according to claim 23, wherein when the component cannot be mounted at the mounting position as specified in said circuit board data, said data generator generates an error-state 3D graphics data for representing a defective part or a cause thereof, and said data display unit displays the image based on said 3D graphics data and said error-state 3D graphics data.

27. The apparatus according to claim 23, wherein said facility operation data storage further receives operation requirements for one or more inspecting devices for inspecting the mount state of the electronic components, and said data generator further generates 3D graphics data for displaying in 3D a component assignment to each inspecting device, an order of inspecting the components, and a possible facility operation interference range by using the information corresponding to the mounting positions included in said circuit board data as inspection position information.

28. The apparatus according to claim 23, wherein said design analyzer further includes a data editor for changing said stored circuit board data or said stored facility operation data with regard to component information, mounting position information and a type or placement position information of a suction nozzle, and for storing changed data.

29. The apparatus according to claim 28, wherein said design analyzer further includes a data history manager for storing a storage time of said changed data as a history, and for storing said 3 D graphics data generated based on said changed data in relation to the history, and when an image is displayed based on 3D graphics data newly generated after the data is changed by said data editor, said data display unit searches for said 3D graphics data generated before the data is changed from said stored history, and displays the image based on said 3D graphics data generated after the data is changed and said 3D graphics data generated before the data is changed to show a difference in the mount state after the data is changed.

30. A recording medium having a program executable on a computer device recorded thereon, said program executing a method of checking a mount quality of a circuit board having components mounted thereon by a mounting device, said method comprising:

receiving board information corresponding to the circuit board to be used in a designed circuit, component information corresponding to the components to be used, and position information corresponding to a mounting position of the components;

receiving a mount requirement specifying a mounting process and a mounting device to be used in manufacturing the circuit board; and checking, based on a requirement for said mounting process and a requirement for operation of the mounting device, to see whether the circuit board manufactured from said board information, said component information, and said position information under said mount requirement can satisfy a predetermined target mount quality.

31. The recording medium according to claim 30, wherein said method further includes retrieving said component information and said requirement for operation of the mounting device from a CAM system that generates operation data of the mounting device.

32. The recording medium according to claim 30, wherein, in said checking to see whether the circuit board can satisfy a predetermined target mount quality, if the circuit board does not satisfy a predetermined mount quality, the circuit board is changed and the mount quality is then rechecked only in a range corresponding to a portion changed or at a portion at which an error occurred.

33. A recording medium having a program executable on a computer device recorded thereon, said program for executing a method of virtually displaying a mount state of electronic components mounted on a circuit board by one or more mounting devices based on data used by the mounting devices, comprising the steps of:

receiving, as the data used by the mounting devices, circuit board data including information corresponding to mounting positions and shapes of components mounted on the circuit board, and information corresponding to a shape of the circuit board;

receiving, for each of the mounting devices, facility operation data including information corresponding to operation requirements of each of the mounting devices;

storing said circuit board data and said facility operation data;

selecting a circuit board from said stored circuit board data to be displayed in 3D;

generating 3D graphics data for displaying outer shapes of the circuit board and the components at respective mounting positions by retrieving, from said stored facility operation data, data required for said circuit board data of the selected circuit board, and calculating data representing a state of the circuit board having the components mounted thereon; and displaying an image based on said generated 3D graphics data.

34. The recording medium according to claim 33, wherein said facility operation data including information corresponding to operation requirements of each of the mounting devices comprises a type and placement position of a suction nozzle to be used, an allowable distance between the components, and an operational area of the suction nozzle.

35. The recording medium according to claim 33, wherein in said generating 3D graphics data, said 3D graphics data is generated for displaying, in 3D, positions of the components after the components are mounted, a component assignment to each mounting device, an order of mounting the components, and a state of any component being sucked by a suction nozzle.

36. The recording medium according to claim 33, wherein in said displaying an image, a mounting operation is displayed by successively displaying moving images according to an order of mounting the components.

37. The recording medium according to claim 33, wherein said method further includes changing said stored circuit board data or said stored facility operation data with regard to component information, mounting position information and a type or placement position information of a suction nozzle, and storing changed data.

38. The recording medium according to claim 37, wherein in said changing said stored circuit data or said stored facility operation data, a storage time of said changed data is stored as a history, in said displaying an image, when an image is displayed based on 3D graphics data newly generated after the data is changed, said 3D graphics data generated before the data is changed is searched for in said stored history, and the image is displayed based on said 3D graphics data generated after the data is changed and said 3D graphics data generated before the data is changed to show a difference in the mount state after the data is changed, and said method further includes storing, as the history, 3D graphics data corresponding to changes in said storage time.

39. The recording medium according to claim 33, wherein in said generating 3D graphics data, when the component cannot be mounted at the mounting position as specified in said circuit board data, an error-state 3D graphics data is generated for representing a defective part or the cause thereof, and in said displaying an image, the image is displayed based on said 3D graphics data and said error-state 3D graphics data.

40. The recording medium according to claim 33, wherein said method further includes:

receiving operation requirements for one or more inspecting devices for inspecting the mount state of the electronic components; and generating 3D graphics data for displaying in 3D a component assignment to each inspecting device, an order of inspecting the components, and a possible range interfered with by a facility operation by using the information corresponding to the mounting positions included in said circuit board data as inspection position information.

41. A program executable on a computer device having said program recorded thereon, said program executing a method of checking a mount quality of a circuit board having components mounted thereon by a mounting device, said method comprising:

receiving board information corresponding to the circuit board to be used in a designed circuit, component information corresponding to the components to be used, and position information corresponding to a respective mounting position of each of the components;

receiving a mount requirement specifying a mounting process and a mounting device to be used in manufacturing the circuit board; and checking, based on a requirement for said mounting process and a requirement for operation of the mounting device, to see whether the circuit board manufactured from said board information, said component information, and said position information under said mount requirement can satisfy a predetermined target mount quality.

42. The program according to claim 41, wherein said method further includes retrieving said component information and said requirement for operation of the mounting device from a CAM system that generates operation data of the mounting device.

43. The program according to claim 41, wherein, in said checking to see whether the circuit board can satisfy a predetermined target mount quality, if the circuit board does not satisfy a predetermined mount quality, the circuit board is changed and the mount quality is then rechecked only in a range corresponding to a portion changed or at a portion at which an error occurred.

44. A program executable on a computer device having said program recorded thereon, said program for executing a method of virtually displaying a mount state of electronic components mounted on a circuit board by one or more mounting devices based on data used by the mounting devices, said method comprising:

receiving, as the data used by the mounting devices, circuit board data including information corresponding to mounting positions and shapes of components mounted on the circuit board, and information corresponding to a shape of the circuit board;

receiving, for each of the mounting devices, facility operation data including information corresponding to operation requirements of each of the mounting devices;

storing said circuit board data and said facility operation data;

selecting a circuit board from said stored circuit board data to be displayed in 3D;

generating 3D graphics data for displaying outer shapes of the circuit board and the components at respective mounting positions by retrieving, from said stored facility operation data, data required for said circuit board data of the selected circuit board, and calculating data representing a state of the circuit board having the components mounted thereon; and displaying an image based on said generated 3D graphics data.

45. The program according to claim 44, wherein said facility operation data including information corresponding to operation requirements of each of the mounting devices comprises a type and placement position of a suction nozzle to be used, an allowable distance between the components, and an operational area of the suction nozzle.

46. The program according to claim 44, herein in said generating 3D graphics data, said 3D graphics data is generated for displaying, in 3D, positions of the components after the components are mounted, a component assignment to each mounting device, an order of mounting the components, and a state of any component being sucked by a suction nozzle.

47. The program according to claim 44, wherein in said displaying an image, a mounting operation is displayed by successively displaying moving images according to an order of mounting the components.

48. The program according to claim 44, wherein said method further includes changing said stored circuit board data or said stored facility operation data with regard to component information, mounting position information and a type or placement position information of a suction nozzle, and storing changed data.

49. The program according to claim 48, wherein in said changing said stored circuit data or said stored facility operation data, a storage time of said changed data is stored as a history, in said displaying an image, when an image is displayed based on 3D graphics data newly generated after the data is changed, said 3D graphics data generated before the data is changed is searched for in said stored history, and the image is displayed based on said 3D graphics data generated after the data is changed and said 3D graphics data generated before the data is changed to show a difference in the mount state after the data is changed, and said method further includes storing, as the history, 3D graphics data corresponding to changes in said storage time.

50. The program according to claim 44, wherein in said generating 3D graphics data, when the component cannot be mounted at the mounting position as specified in said circuit board data, an error-state 3D graphics data is generated for representing a defective part or the cause thereof, and in said displaying an image, the image is displayed based on said 3D graphics data and said error-state 3D graphics data.

51. The program according to claim 44, wherein said method further includes:

receiving operation requirements for one or more inspecting devices for inspecting the mount state of the electronic components; and generating 3D graphics data for displaying in 3D a component assignment to each inspecting device, an order of inspecting the components, and a possible facility operation interference range by using the information corresponding to the mounting positions included in said circuit board data as inspection position information.

* * * * *